(12) United States Patent
Mochizuki et al.

(10) Patent No.: US 12,261,173 B2
(45) Date of Patent: Mar. 25, 2025

(54) SEMICONDUCTOR DEVICE WITH STRAINED CHANNEL

(71) Applicant: International Business Machines Corporation, Armonk, NY (US)

(72) Inventors: Shogo Mochizuki, Mechanicville, NY (US); Nicolas Loubet, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 847 days.

(21) Appl. No.: 17/464,788

(22) Filed: Sep. 2, 2021

(65) Prior Publication Data

US 2023/0065852 A1    Mar. 2, 2023

(51) Int. Cl.
   *H01L 27/092* (2006.01)
   *H01L 21/8238* (2006.01)

(52) U.S. Cl.
   CPC .... *H01L 27/092* (2013.01); *H01L 21/823807* (2013.01)

(58) Field of Classification Search
   CPC ........... H01L 27/092; H01L 21/823807; H01L 29/045; H01L 29/1054; H01L 29/0673; H01L 29/42392; H01L 29/66439; H01L 29/66545; H01L 29/775; H01L 29/78696; B82Y 10/00
   See application file for complete search history.

(56) References Cited

U.S. PATENT DOCUMENTS

| | | | |
|---|---|---|---|
| 9,543,388 B2 | 1/2017 | Lauer et al. | |
| 10,211,307 B2 | 2/2019 | Ching et al. | |
| 10,243,060 B2 | 3/2019 | Chao et al. | |
| 10,332,809 B1* | 6/2019 | Ando | H01L 29/66439 |
| 10,727,298 B2 | 7/2020 | Peng et al. | |
| 2013/0285118 A1 | 10/2013 | Majumdar et al. | |
| 2019/0035911 A1* | 1/2019 | Cheng | H01L 29/0653 |
| 2019/0067452 A1* | 2/2019 | Cheng | B82Y 10/00 |
| 2020/0075718 A1 | 3/2020 | Wang et al. | |
| 2022/0352180 A1* | 11/2022 | Lin | H01L 29/66553 |
| 2024/0186393 A1* | 6/2024 | Bao | H01L 29/0673 |

OTHER PUBLICATIONS

M. Lapedus, "New Transistor Structures at 3nm/2nm," https://semiengineering.com/new-transistor-structures-at-3nm-2nm/, Jan. 25, 2021, 8 pages.
K. Cheng et al., "High Performance Extremely Thin SOI (ETSOI) Hybrid CMOS with Si Channel NFET and Strained SiGe Channel PFET," 2012 International Electron Devices Meeting, Dec. 2012, 4 pages.
W. W. Fang et al., "Vertically Stacked SiGe Nanowire Array Channel CMOS Transistors," IEEE Electron Device Letters, vol. 28, No. 3, Mar. 2007, pp. 211-213.
S. H. Olsen et al., "High-Performance nMOSFETs Using a Novel Strained Si/SiGe CMOS Architecture," IEEE Transactions on Electron Devices, vol. 50, No. 9, Sep. 2003, pp. 1961-1969.

* cited by examiner

*Primary Examiner* — Allison Bernstein
(74) *Attorney, Agent, or Firm* — L. Jeffrey Kelly; Ryan, Mason & Lewis, LLP

(57) ABSTRACT

A semiconductor structure includes a p-type field-effect transistor region and an n-type field-effect transistor region. The p-type field-effect transistor region includes a strained channel of a composite of silicon germanium and silicon. The n-type field-effect transistor region includes a silicon channel.

20 Claims, 16 Drawing Sheets

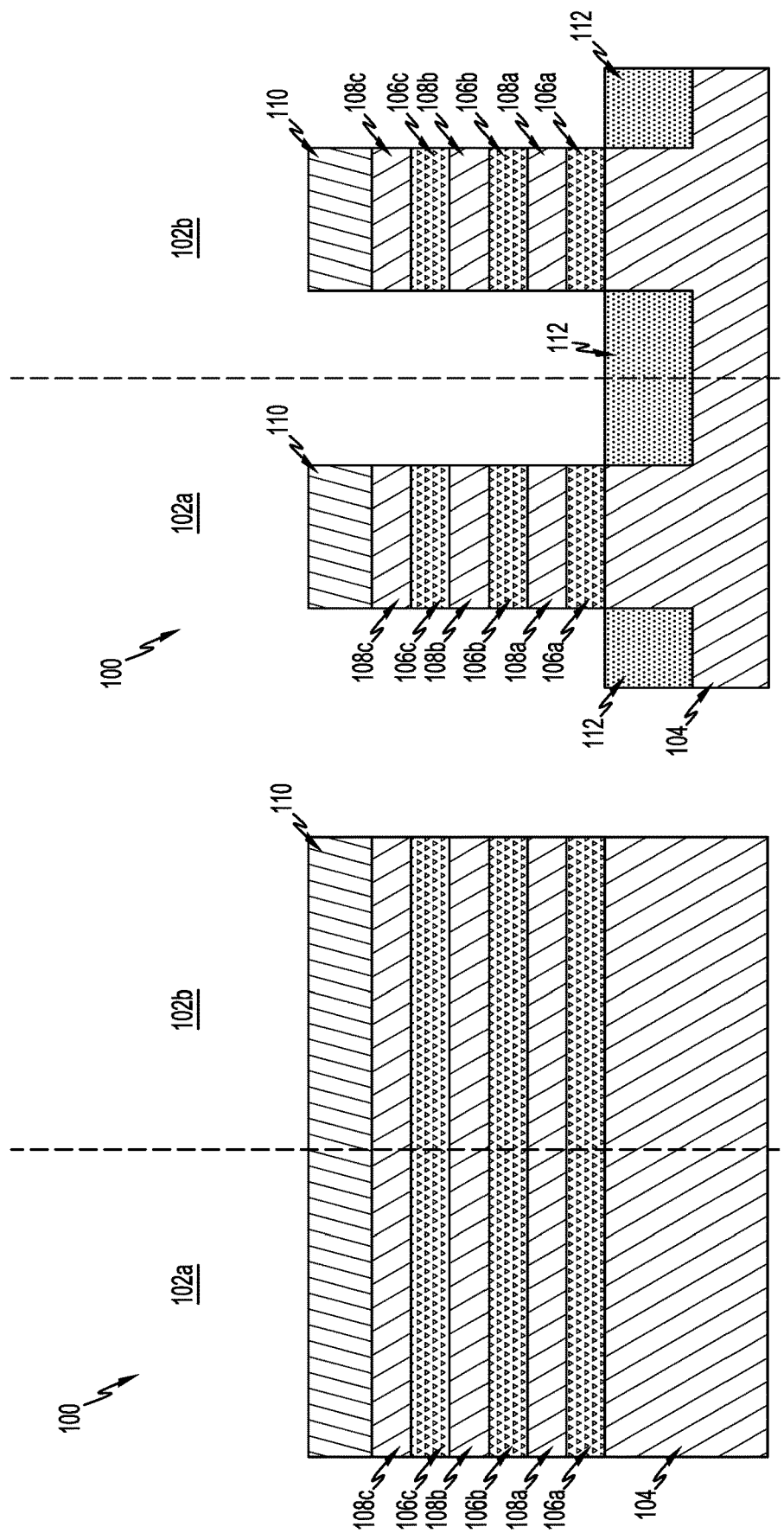

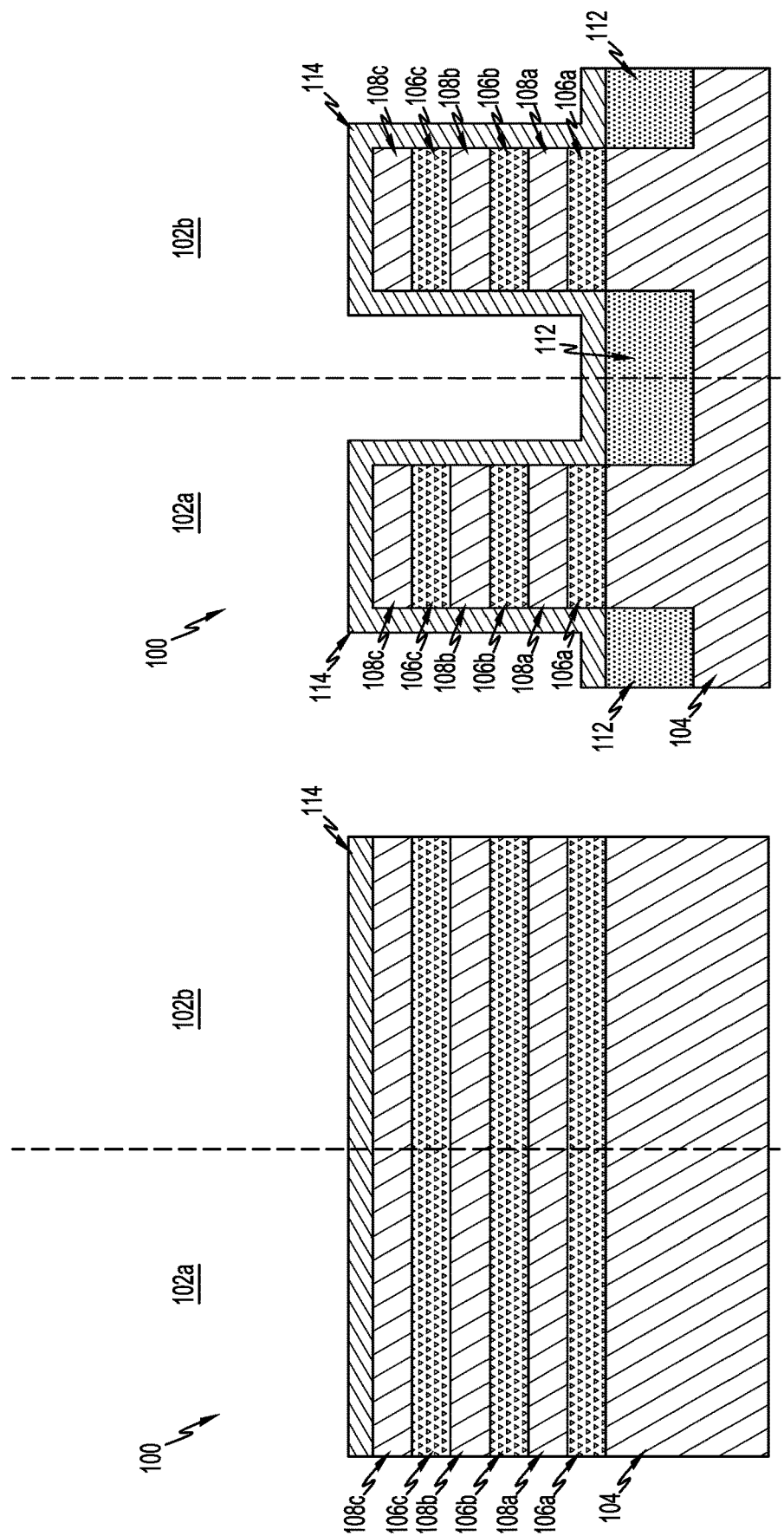

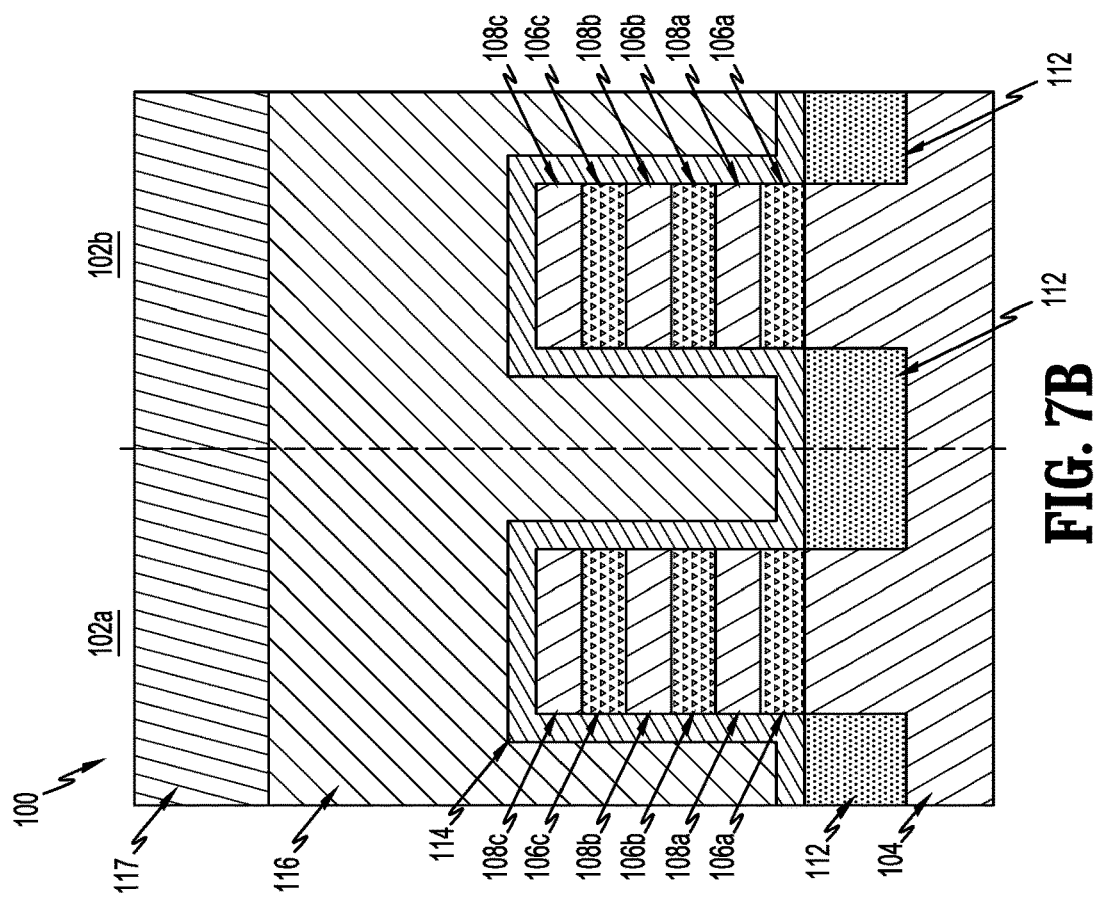
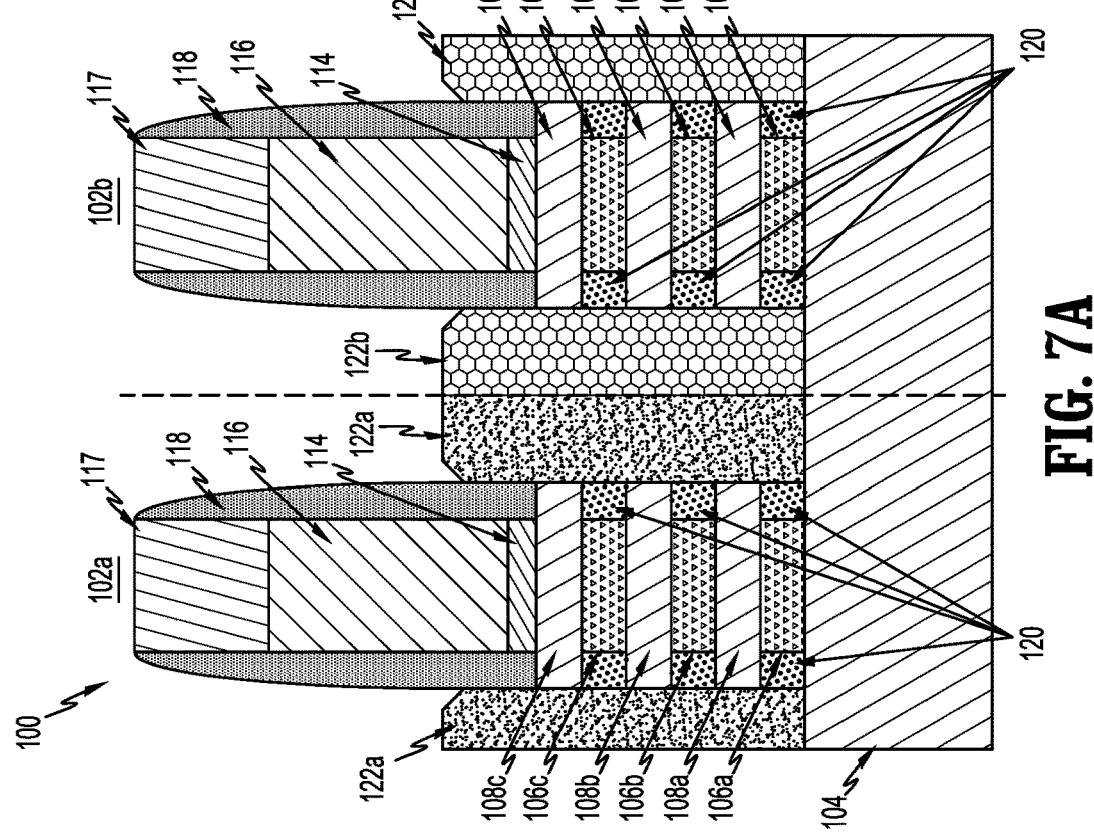
FIG. 7A
FIG. 7B

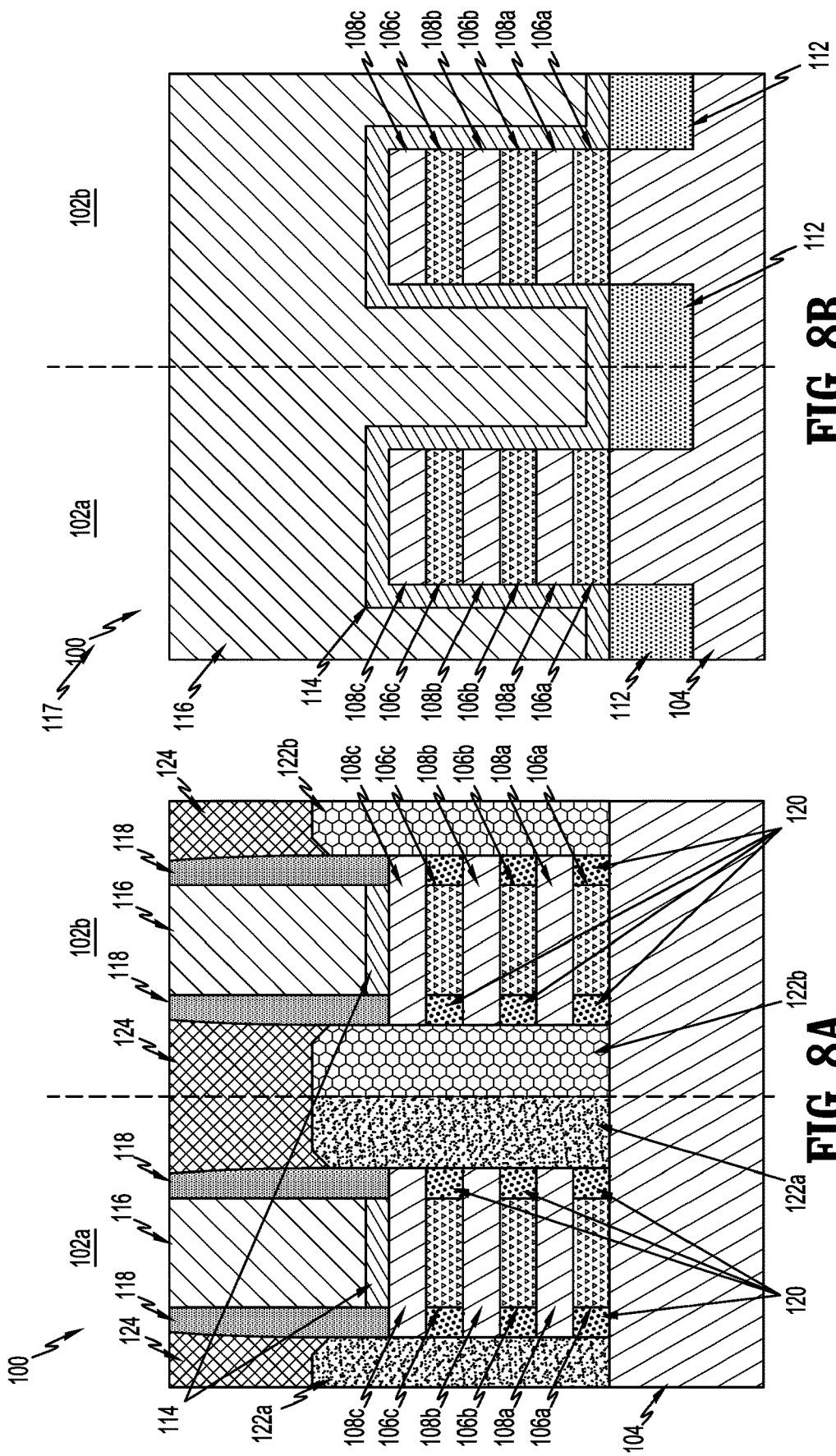

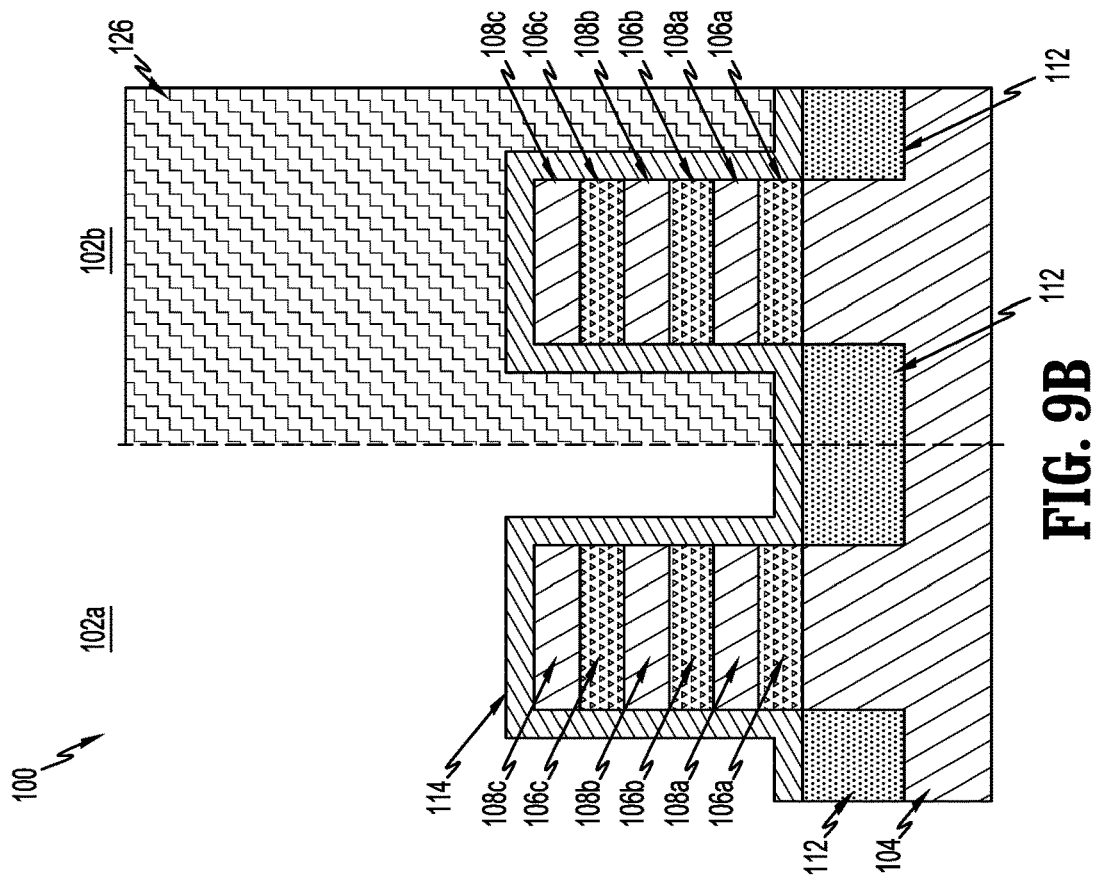
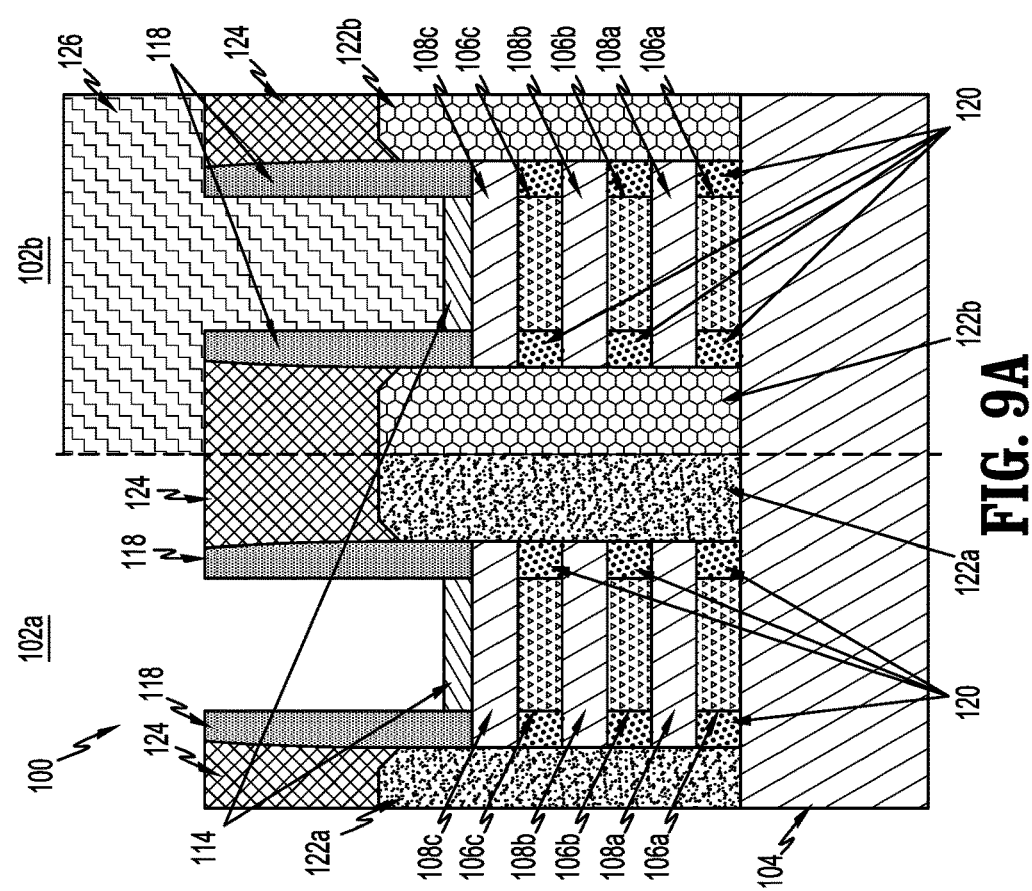
FIG. 9A
FIG. 9B

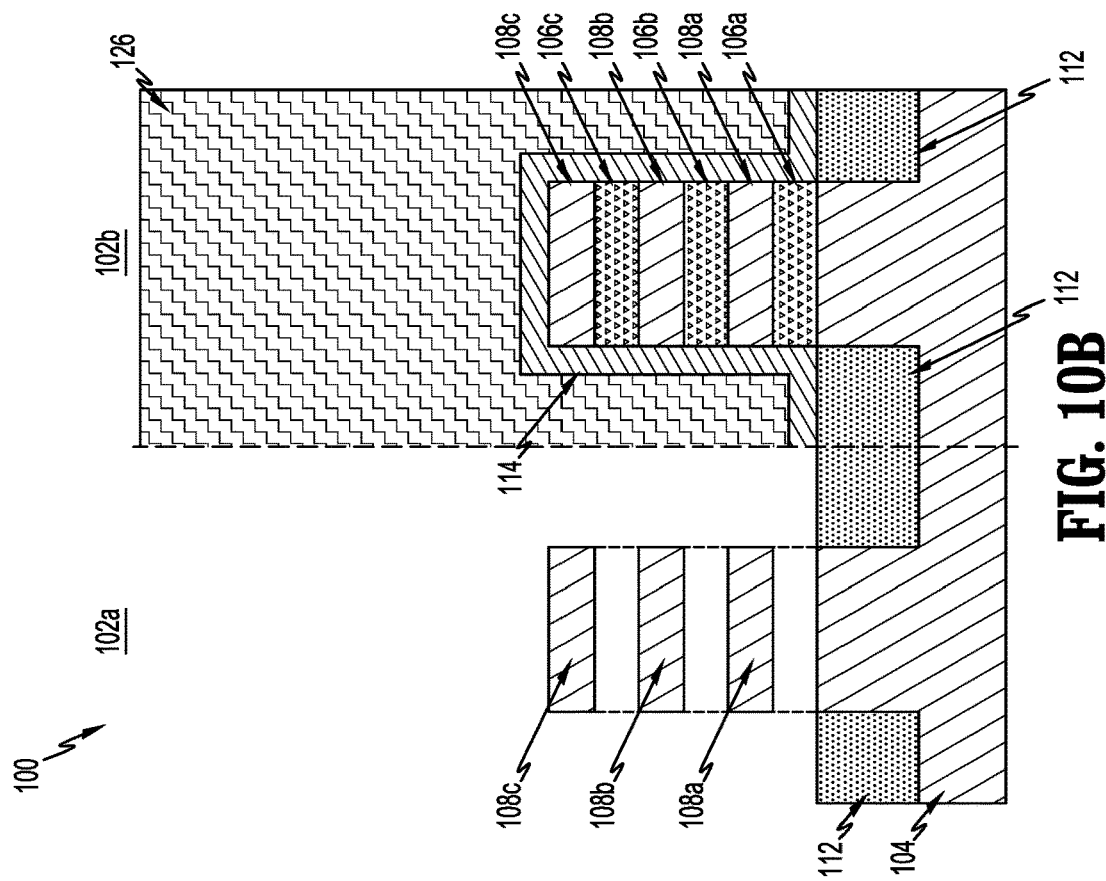
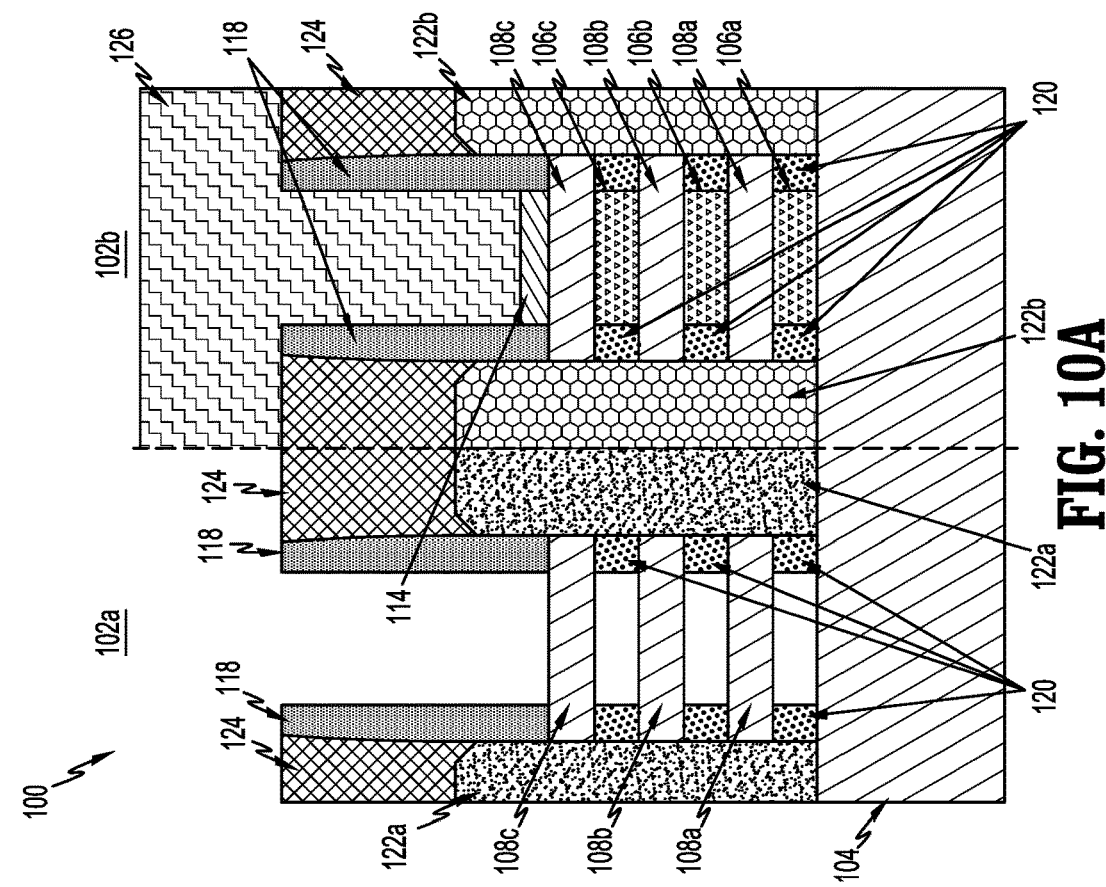

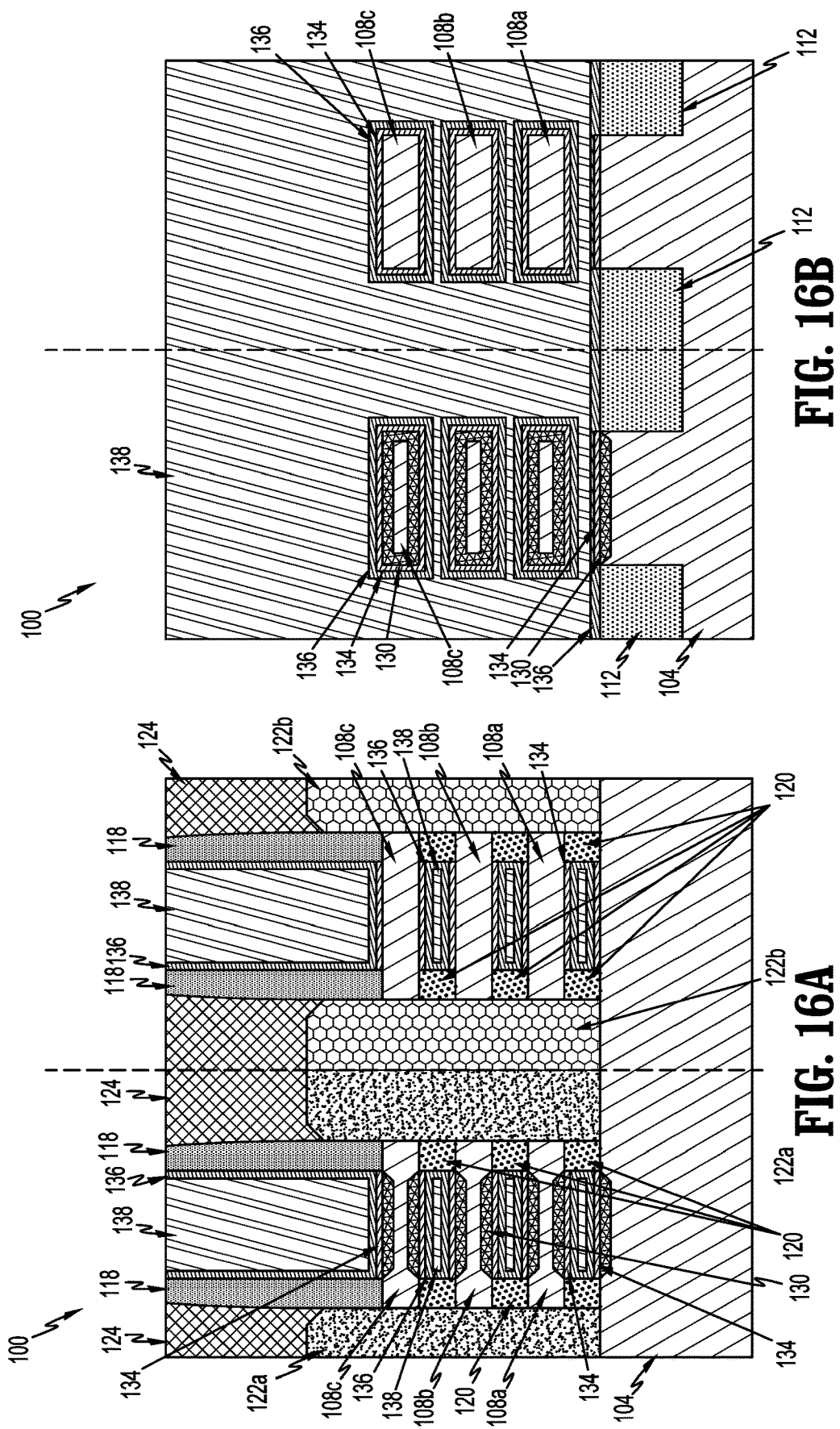

SEMICONDUCTOR DEVICE WITH STRAINED CHANNEL

BACKGROUND

This disclosure relates generally to semiconductor fabrication techniques and, in particular, to structures and methods for fabricating complementary metal-oxide-semiconductor (CMOS) devices.

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, challenges from both fabrication and design have resulted in the development of fin-type field effect transistor (FinFET) devices. The FinFET device, for example, may be a CMOS device comprising a p-type metal-oxide-semiconductor (PMOS) FinFET device and a n-type metal-oxide-semiconductor (NMOS) FinFET device. CMOS technology is used in a wide variety of circuit designs. It is therefore desirable to have improvements in the fabrication of CMOS FinFET semiconductor structures.

SUMMARY

According to an exemplary embodiment, a semiconductor structure comprises a p-type field-effect transistor region and an n-type field-effect transistor region. The p-type field-effect transistor region comprises a strained channel comprising a composite of silicon germanium and silicon. The n-type field-effect transistor region comprises a silicon channel.

According to an exemplary embodiment, an integrated circuit comprises a plurality of semiconductor structures, wherein at least one of the plurality of semiconductor structures comprises a p-type field-effect transistor region and an n-type field-effect transistor region. The p-type field-effect transistor region comprises a strained channel comprising a composite of silicon germanium and silicon. The n-type field-effect transistor region comprises a silicon channel.

According to an exemplary embodiment, a method for making a semiconductor structure comprises forming a p-type field-effect transistor region and an n-type field-effect transistor region. The p-type field-effect transistor region comprises a strained channel comprising a composite of silicon germanium and silicon. The n-type field-effect transistor region comprises a silicon channel.

These and other exemplary embodiments will be described in or become apparent from the following detailed description of exemplary embodiments, which is to be read in connection with the accompanying drawings.

BRIEF DESCRIPTION OF THE DRAWINGS

Exemplary embodiments will be described below in more detail, with reference to the accompanying drawings, of which:

FIG. 3A is a cross-sectional view illustrating the semiconductor structure taken along the X-X axis of FIG. 2A at a third-intermediate fabrication stage, according to an illustrative embodiment.

FIG. 3B is a cross-sectional view of the semiconductor structure taken along the Y-Y axis of FIG. 2A at the third-intermediate fabrication stage, according to an illustrative embodiment.

FIG. 4A is a cross-sectional view illustrating the semiconductor structure taken along the X-X axis of FIG. 2A at a fourth-intermediate fabrication stage, according to an illustrative embodiment.

FIG. 4B is a cross-sectional view of the semiconductor structure taken along the Y-Y axis of FIG. 2A at the fourth-intermediate fabrication stage, according to an illustrative embodiment.

FIG. 7A is a cross-sectional view illustrating the semiconductor structure taken along the X-X axis of FIG. 2A at a seventh-intermediate fabrication stage, according to an illustrative embodiment.

FIG. 7B is a cross-sectional view of the semiconductor structure taken along the Y-Y axis of FIG. 2A at the seventh-intermediate fabrication stage, according to an illustrative embodiment.

FIG. 8A is a cross-sectional view illustrating the semiconductor structure taken along the X-X axis of FIG. 2A at an eighth-intermediate fabrication stage, according to an illustrative embodiment.

FIG. 8B is a cross-sectional view of the semiconductor structure taken along the Y-Y axis of FIG. 2A at the eighth-intermediate fabrication stage, according to an illustrative embodiment.

FIG. 9A is a cross-sectional view illustrating the semiconductor structure taken along the X-X axis of FIG. 2A at a ninth-intermediate fabrication stage, according to an illustrative embodiment.

FIG. 9B is a cross-sectional view of the semiconductor structure taken along the Y-Y axis of FIG. 2A at the ninth-intermediate fabrication stage, according to an illustrative embodiment.

FIG. 10A is a cross-sectional view illustrating the semiconductor structure taken along the X-X axis of FIG. 2A at a tenth-intermediate fabrication stage, according to an illustrative embodiment.

FIG. 10B is a cross-sectional view of the semiconductor structure taken along the Y-Y axis of FIG. 2A at the tenth-intermediate fabrication stage, according to an illustrative embodiment.

FIG. 16A is a cross-sectional view illustrating the semiconductor structure taken along the X-X axis of FIG. 2A at a sixteenth-intermediate fabrication stage, according to an illustrative embodiment.

FIG. 16B is a cross-sectional view of the semiconductor structure taken along the Y-Y axis of FIG. 2A at the sixteenth-intermediate fabrication stage, according to an illustrative embodiment.

DETAILED DESCRIPTION

Figure 2A:
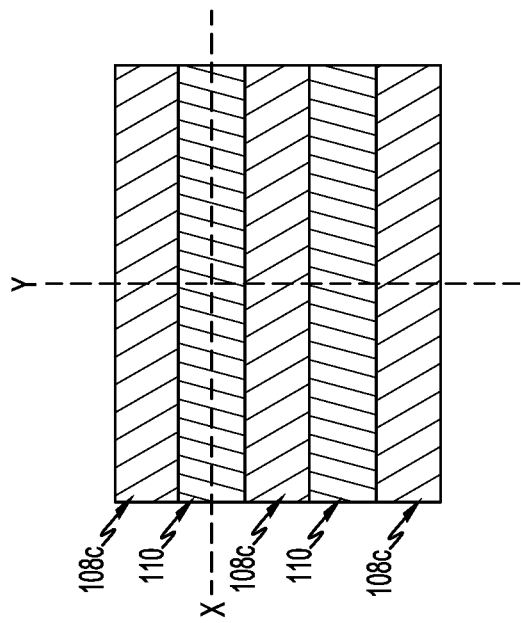
FIG. 2A is a top view illustrating the semiconductor structure at a second-intermediate fabrication stage, according to an illustrative embodiment.

This disclosure relates generally to transistors, and more particularly to CMOS field effect transistors with Gate-All-Around (GAA) structures and methods for their fabrication.

GAA CMOS FET devices are a promising option for technology scaling for 5 nm and beyond. A CMOS device includes a p-type field-effect transistor (PFET) region on one side of the device and an n-type field-effect transistor (NFET) region on the other side. As semiconductor devices continue to scale, stress engineering from external stressors becomes more challenging. A strained silicon germanium channel can be utilized to more efficiently generate the channel strain necessary to achieve high mobility for carrier transport. Integrating a silicon channel for NFET devices and a strained SiGe channel for PFET devices on the same wafer can be challenging. However, one or more embodiments discussed below provide methods and structures for forming silicon NFET channels and strained PFET channels comprising a composite of silicon germanium and silicon on the same wafer without significantly increasing the process complexity. Accordingly, illustrative embodiments described herein correspond to a CMOS device having a strained silicon germanium and silicon composite channel in the PFET region that exhibits improved carrier charge mobility as compared to an unstrained silicon germanium channel in the PFET region.

It is to be understood that the various layers, structures, and regions shown in the accompanying drawings are schematic illustrations that are not drawn to scale. In addition, for ease of explanation, one or more layers, structures, and regions of a type commonly used to form semiconductor devices or structures may not be explicitly shown in a given drawing. This does not imply that any layers, structures, and regions not explicitly shown are omitted from the actual semiconductor structures.

Furthermore, it is to be understood that the embodiments discussed herein are not limited to the particular materials, features, and processing steps shown and described herein. In particular, with respect to semiconductor processing steps, it is to be emphasized that the descriptions provided herein are not intended to encompass all of the processing steps that may be required to form a functional semiconductor integrated circuit device. Rather, certain processing steps that are commonly used in forming semiconductor devices, such as, for example, wet cleaning and annealing steps, are purposefully not described herein for economy of description.

Moreover, the same or similar reference numbers are used throughout the drawings to denote the same or similar features, elements, or structures, and thus, a detailed explanation of the same or similar features, elements, or structures will not be repeated for each of the drawings. It is to be understood that the terms "about" or "substantially" as used herein with regard to thicknesses, widths, percentages, ranges, etc., are meant to denote being close or approximate to, but not exactly. For example, the term "about" or "substantially" as used herein implies that a small margin of error may be present, such as 1% or less than the stated amount.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment. The term "positioned on" means that a first element, such as a first structure, is present on a second element, such as a second structure, wherein intervening elements, such as an interface structure, e.g., interface layer, may be present between the first element and the second element. The term "direct contact" means that a first element, such as a first structure, and a second element, such as a second structure, are connected without any intermediary conducting, insulating or semiconductor layers at the interface of the two elements.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

As used herein, "height" refers to a vertical size of an element (e.g., a layer, trench, hole, opening, etc.) in the cross-sectional views measured from a bottom surface to a top surface of the element, and/or measured with respect to a surface on which the element is located. Conversely, a "depth" refers to a vertical size of an element (e.g., a layer, trench, hole, opening, etc.) in the cross-sectional views measured from a top surface to a bottom surface of the element. Terms such as "thick", "thickness", "thin" or derivatives thereof may be used in place of "height" where indicated.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

Referring now to the drawings in which like numerals represent the same of similar elements, FIGS. 1A-16B illustrate various processes for fabricating CMOS devices with a strained PFET channel. Note that the same reference numeral (100) is used to denote the semiconductor structure through the various intermediate fabrication stages illustrated in FIGS. 1A through 16B. Note also that the semiconductor structure described herein can also be considered to be a semiconductor device and/or an integrated circuit, or some part thereof. For the purpose of clarity, some fabrication steps leading up to the production of the semiconductor structures as illustrated in FIGS. 1A-16B are omitted. In other words, one or more well-known processing steps which are not illustrated but are well-known to those of ordinary skill in the art have not been included in the figures. This is not intended to be interpreted as a limitation of any particular embodiment, or illustration, or scope of the claims.

Figure 1:
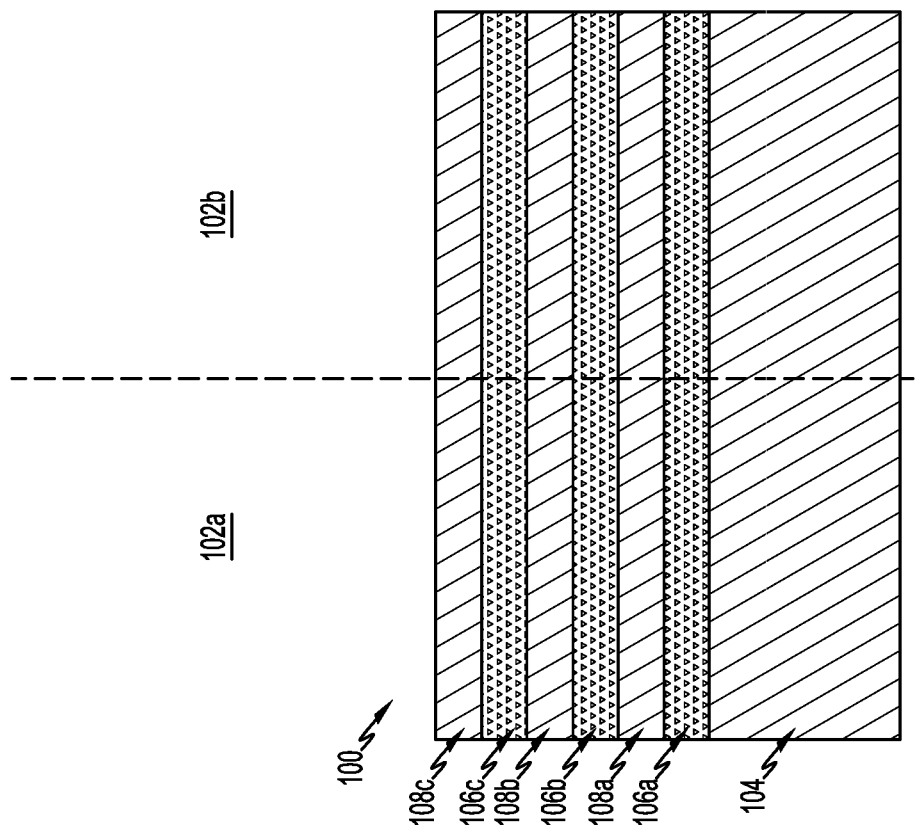
FIG. 1 is a cross-sectional view illustrating a semiconductor structure for use at a first-intermediate fabrication stage, according to an illustrative embodiment.

FIG. 1 illustrates semiconductor structure 100 at a first-intermediate fabrication stage. FIG. 1 shows a semiconductor structure 100 for forming a PFET region 102$a$ and an NFET region 102$b$. Semiconductor structure 100 of FIG. 1 includes substrate 104 having alternating nanosheets layers of layers 106$a$, 106$b$ and 106$c$ with layers 108$a$, 108$b$ and 108$c$ on substrate 104. In general, substrate 104 can be composed of any currently known or later developed semiconductor material such as, for example, silicon (Si), germanium (Ge), silicon germanium (SiGe), silicon carbide (SiC), Si:C (carbon doped silicon), silicon germanium carbide (SiGeC), carbon doped silicon germanium (SiGe:C), compound semiconductor materials (e.g., Groups III-V), or other like semiconductor material. Semiconductor substrate 104 can also be a bulk substrate or a semiconductor-on-insulator substrate such as, but not limited to, a silicon-on-insulator (SOI), silicon-germanium-on-insulator (SGOI) or Groups III-V-on-insulator substrate including a buried insulating layer, such as, for example, a buried oxide, nitride layer or aluminum oxide.

In one illustrative embodiment, alternating nanosheets layers of layers 106$a$, 106$b$ and 106$c$ with layers 108$a$, 108$b$ and 108$c$ include alternating layers of sacrificial layers 106$a$, 106$b$ and 106$c$ with layers of silicon 108$a$, 108$b$ and 108$c$. Sacrificial layers 106$a$, 106$b$ and 106$c$ include epitaxial grown semiconductor material such as silicon-germanium (SiGe). A suitable semiconductor material for layers 106$a$, 106$b$ and 106$c$ can be SiGe$_x$ such as, for example, SiGe$_{20-80}$. Representative examples of SiGe$_x$ can be SiGe$_{20}$, SiGe$_{25}$, SiGe$_{30}$ . . . SiGe$_{65}$.

The terms "epitaxial grown" and "epitaxially forming and/or growing" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100}crystal surface may take on a {100}orientation. In some embodiments, epitaxial growth processes may be selective to forming on semiconductor surfaces, and may not deposit material on dielectric surfaces, such as silicon dioxide or silicon nitride surfaces. Although semiconductor structure 100 is depicted with three layers each of layers 106$a$, 106$b$ and 106$c$ and layers 108$a$, 108$b$ and 108$c$, any number and combination of layers can be used so long as the layers alternate between sacrificial layers and Si layers.

Examples of various epitaxial growth processes include, for example, rapid thermal chemical vapor deposition (RT-CVD), low-energy plasma deposition (LEPD), ultra-high vacuum chemical vapor deposition (UHVCVD), atmospheric pressure chemical vapor deposition (APCVD) and molecular beam epitaxy (MBE). The temperature for an epitaxial deposition process can range from 500° C. to 900° C. Although higher temperature typically results in faster deposition, the faster deposition may result in crystal defects and film cracking.

Figure 2C:
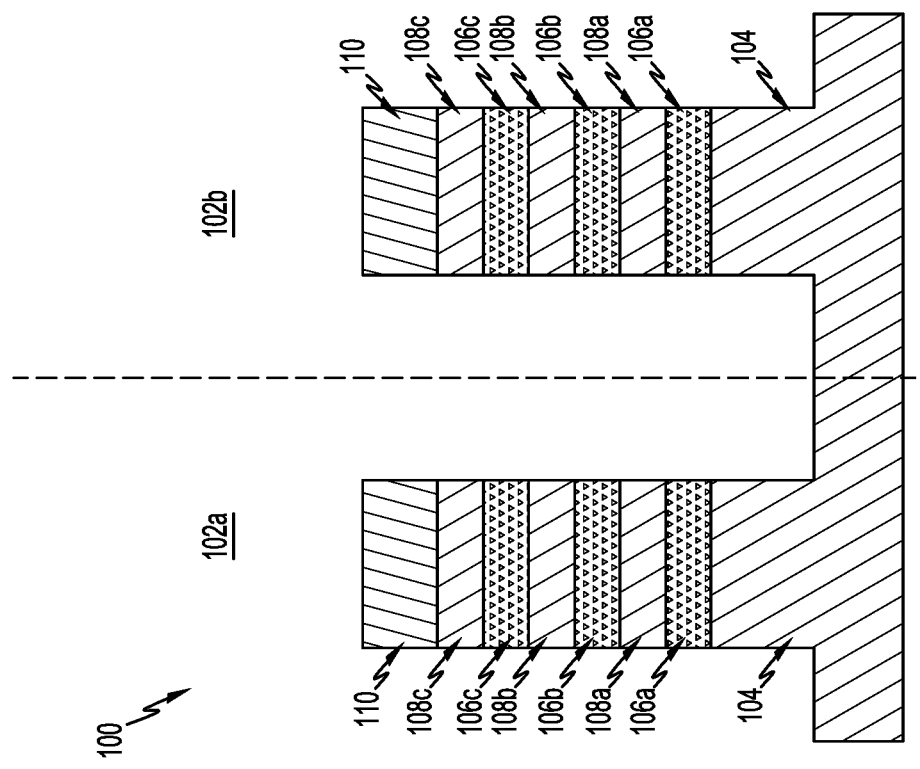
FIG. 2C is a cross-sectional view of the semiconductor structure taken along the Y-Y axis of FIG. 2A at the second-intermediate fabrication stage, according to an illustrative embodiment.
Figure 2B:
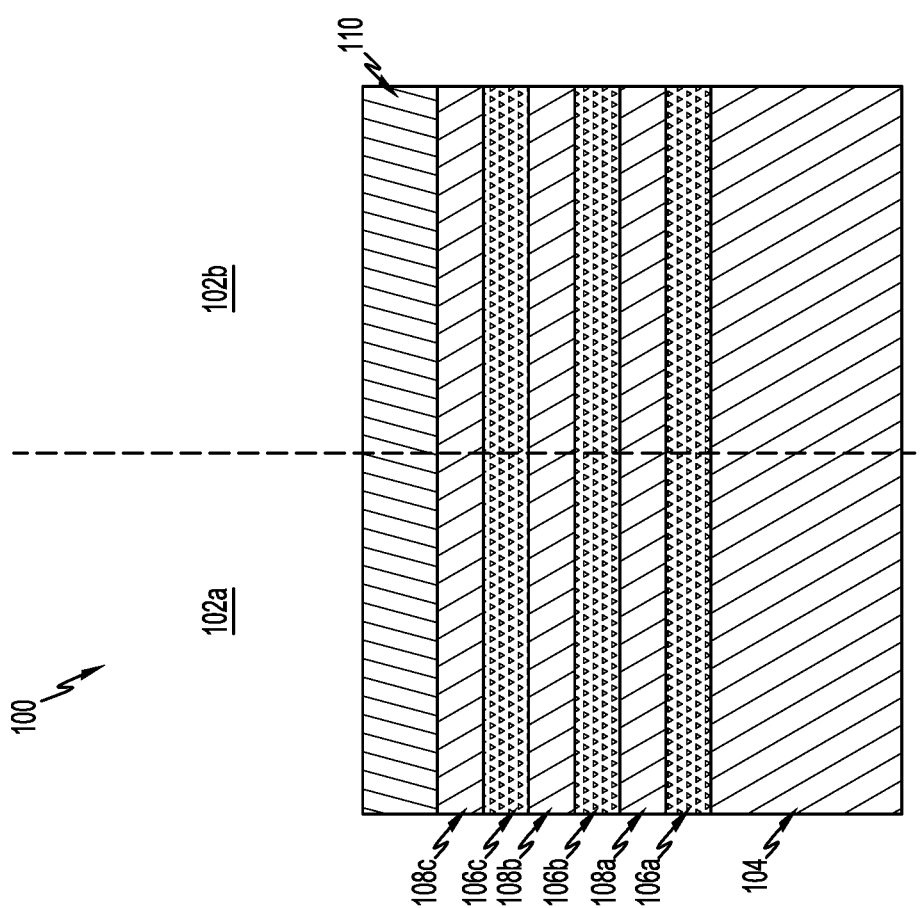
FIG. 2B is a cross-sectional view illustrating the semiconductor structure taken along the X-X axis of FIG. 2A at a second-intermediate fabrication stage, according to an illustrative embodiment.

FIGS. 2A-2C illustrate semiconductor structure 100 at a second-intermediate fabrication stage. During this stage, a hardmask 110 is deposited over the top-most surface of top nanosheet layer 108$c$ by any conventional technique. For example, hardmask 110 can be deposited by, for example, chemical vapor deposition (CVD), low-pressure CVD (LPCVD), plasma-enhanced CVD (PECVD), semi-atmosphere CVD (SACVD) and high density plasma CVD (HDPCVD), rapid thermal CVD (RTCVD), ultra-high vacuum CVD (UHVCVD), limited reaction processing CVD (LRPCVD), metalorganic CVD (MOCVD), sputtering deposition, ion beam deposition, electron beam deposition, laser assisted deposition, thermal oxidation, thermal nitridation, spin-on methods, physical vapor deposition (PVD), atomic layer deposition (ALD), chemical oxidation, molecular beam epitaxy (MBE), plating, and evaporation. Suitable material for hardmask 110 includes, for example, Si$_3$N$_4$, SiBCN, SiNC, SiN, SiCO, SiO$_2$, and SiNOC.

During this stage, semiconductor structure 100 is patterned to form a first fin in PFET region 102a and a second fin in an NFET region 102b. The fins can be fabricated using any type of multi-patterning technique such as SIT, SADP, SAQP, etch. For example, the fins may be fabricated using a multi-patterning process which comprises (i) depositing a layer of sacrificial material on the hardmask layer 110, (ii) patterning the layer of sacrificial material to form a pattern of sacrificial mandrel features, (iii) depositing a conformal layer of mask material (e.g., silicon dioxide ($SiO_2$)) over the sacrificial mandrel features, (iv) etching the conformal layer of mask material using an anisotropic etch-back process to form "spacer" features on the sidewalls of the sacrificial mandrel features, and then (v) etching away the sacrificial mandrel features selective to the spacer features and the hardmask layer 110 to form first fin in PFET region 102a and second fin in an NFET region 102b shown in FIG. 2B. Each fin includes a portion of substrate 104 and alternating layers of layers 106a, 106b and 106c with layers 108a, 108b and 108c.

FIGS. 3A and 3B illustrate semiconductor structure 100 at a third-intermediate fabrication stage. During this stage, shallow trench isolation (STI) layer 112 is deposited on substrate 104 and around each fin (FIG. 3B). STI layer 112 comprises a dielectric material such as silicon oxide or silicon oxynitride, and is formed by methods known in the art. For example, in one illustrative embodiment, shallow trench isolation layer 112 is a shallow trench isolation oxide layer. In one embodiment, the STI layer 112 is formed by high density plasma chemical vapor deposition (HDP CVD) to deposit, e.g., silicon dioxide in the shallow trenches. The STI deposition is followed by a planarizing process such as a chemical mechanical planarization (CMP) operation and etch back process so that the top surface of STI layer 112 is coplanar with the top surface of substrate 104 of each fin.

FIGS. 4A and 4B illustrate semiconductor structure 100 at a fourth-intermediate fabrication stage. During this stage, hardmask 110 is removed and liner layer 114 is deposited. Hardmask 110 is selectively removed by, for example, a wet etch process. Liner layer 114 is deposited on the exterior surfaces of semiconductor structure 100 using any suitable deposition technique including, for example, CVD, PECVD, radio-frequency CVD (RFCVD), PVD, ALD, molecular layer deposition (MLD), molecular beam deposition (MBD), pulsed laser deposition (PLD), liquid source misted chemical deposition (LSMCD), and/or sputtering. The liner layer 114 can be any suitable oxide material such as, for example, $SiO_2$, $Al_2O_3$, $HfO_2$, $TiO_2$, etc.

Figure 5B:
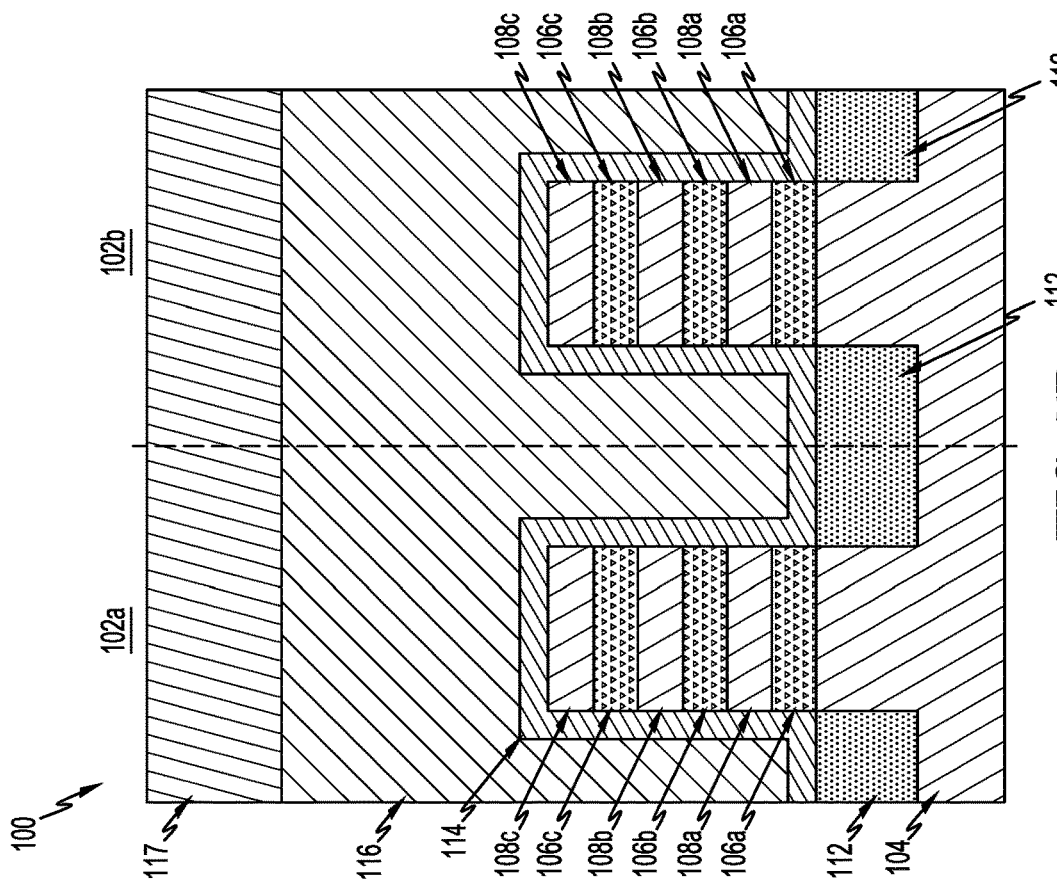
FIG. 5B is a cross-sectional view of the semiconductor structure taken along the Y-Y axis of FIG. 2A at the fifth-intermediate fabrication stage, according to an illustrative embodiment.
Figure 5A:
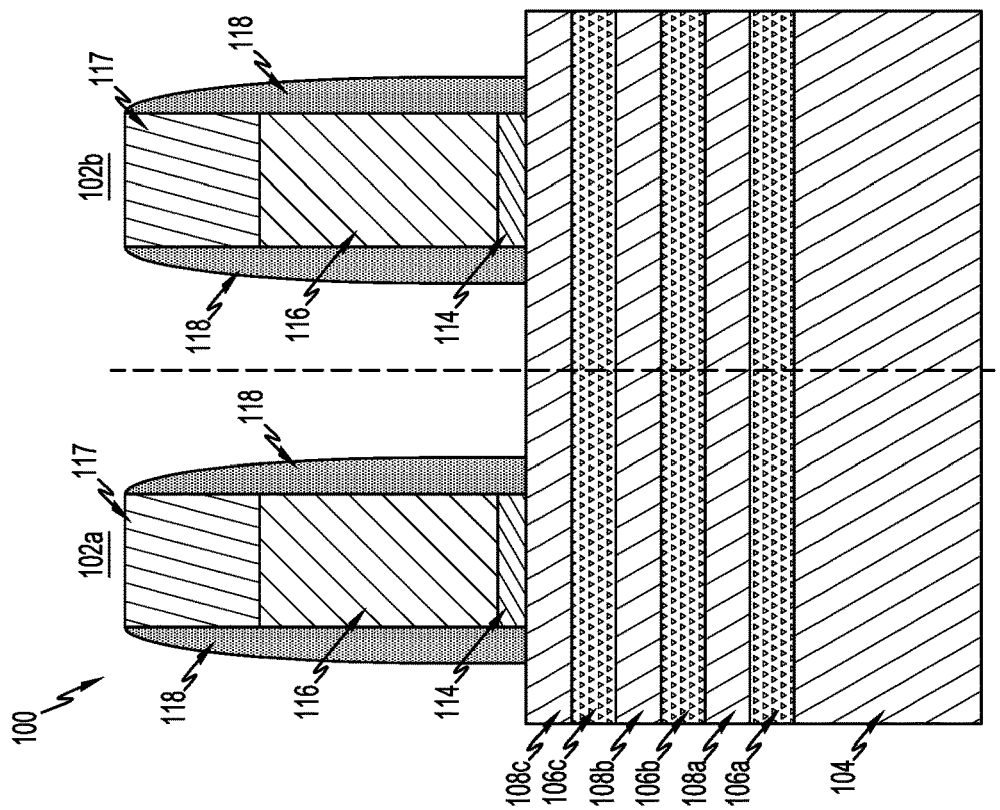
FIG. 5A is a cross-sectional view illustrating the semiconductor structure taken along the X-X axis of FIG. 2A at a fifth-intermediate fabrication stage, according to an illustrative embodiment.

FIGS. 5A and 5B illustrate semiconductor structure 100 at a fifth-intermediate fabrication stage. During this stage, dummy gate 116 is first deposited on liner layer 114. Dummy gates 116 can be formed by first depositing a dummy gate material on liner layer 114 and over and around each fin (see FIG. 5B) by any conventional technique such as, for example, CVD, LPCVD, PECVD, SACVD and HDPCVD. Suitable dummy gate material includes, for example, polycrystalline silicon, amorphous silicon or microcrystal silicon. The dummy gate material can then be subjected to a planarizing process such as a CMP operation.

A hardmask 117 is then deposited over the planarized dummy gate material and patterned to form dummy gates (not shown). For example, an etching process, e.g., RIE, can be used to form the dummy gates 116. Suitable material for hardmask 117 includes, for example, $Si_3N_4$, SiBCN, SiNC, SiN, SiCO, $SiO_2$, and SiNOC.

Sidewall spacers 118 are then deposited on the exterior sidewall surfaces of dummy gate 116 and hardmask 117 (see FIG. 5A). The sidewall spacers 118 may be formed, for example, by forming a conformal layer of sidewall dielectric and removing horizontal portions with a directional etch, e.g., RIE. In one illustrative embodiment, the sidewall spacers 118 can be a nitride or an oxynitride such as, for example, $Si_3N_4$, SiBCN, SiNC, SiN, SiCO, $SiO_2$ and SiNOC. In some exemplary embodiments, sidewall spacers 118 can include a material that is resistant to some etching processes such as, for example, HF chemical etching or chemical oxide removal etching. Following formation of dummy gate 116, the exposed portion of liner layer 114 remaining on nanosheet 108c is removed by conventional techniques, e.g., RIE (FIG. 5A).

Figure 6B:
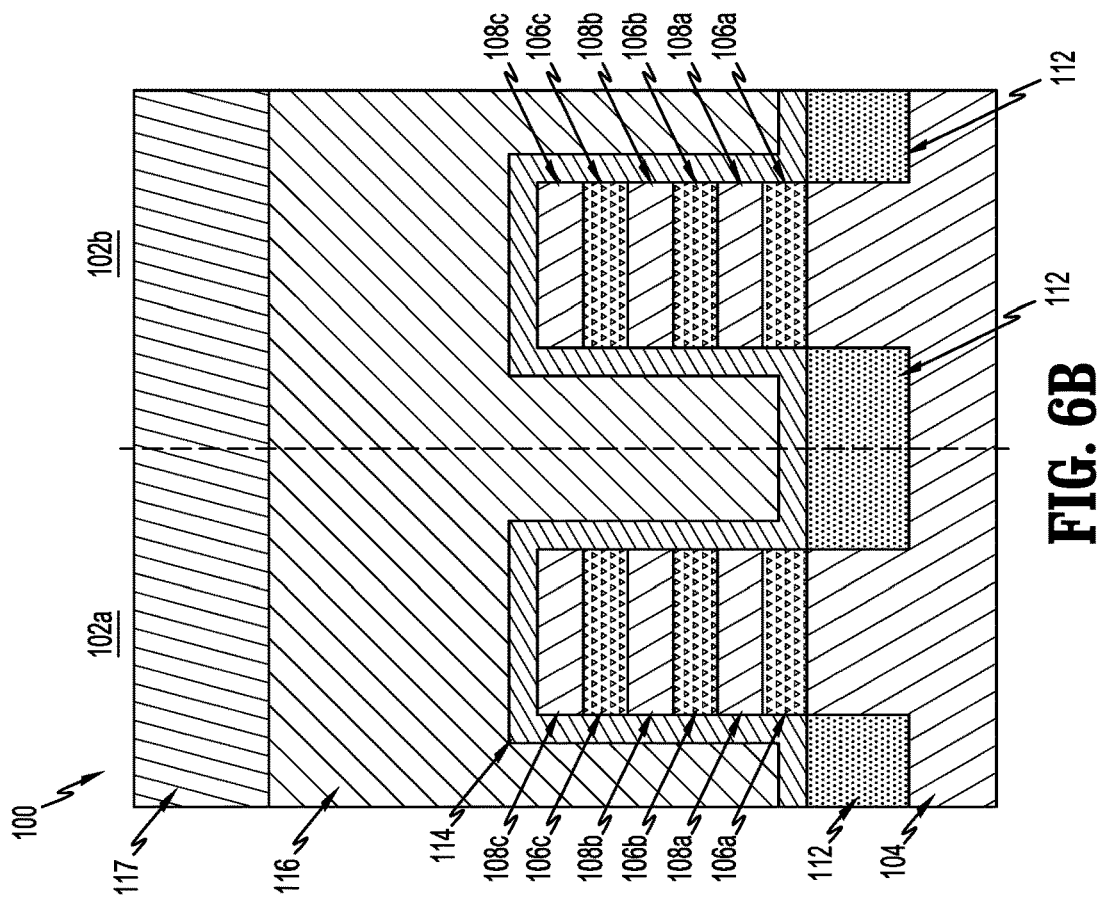
FIG. 6B is a cross-sectional view of the semiconductor structure taken along the Y-Y axis of FIG. 2A at the sixth-intermediate fabrication stage, according to an illustrative embodiment.
Figure 6A:
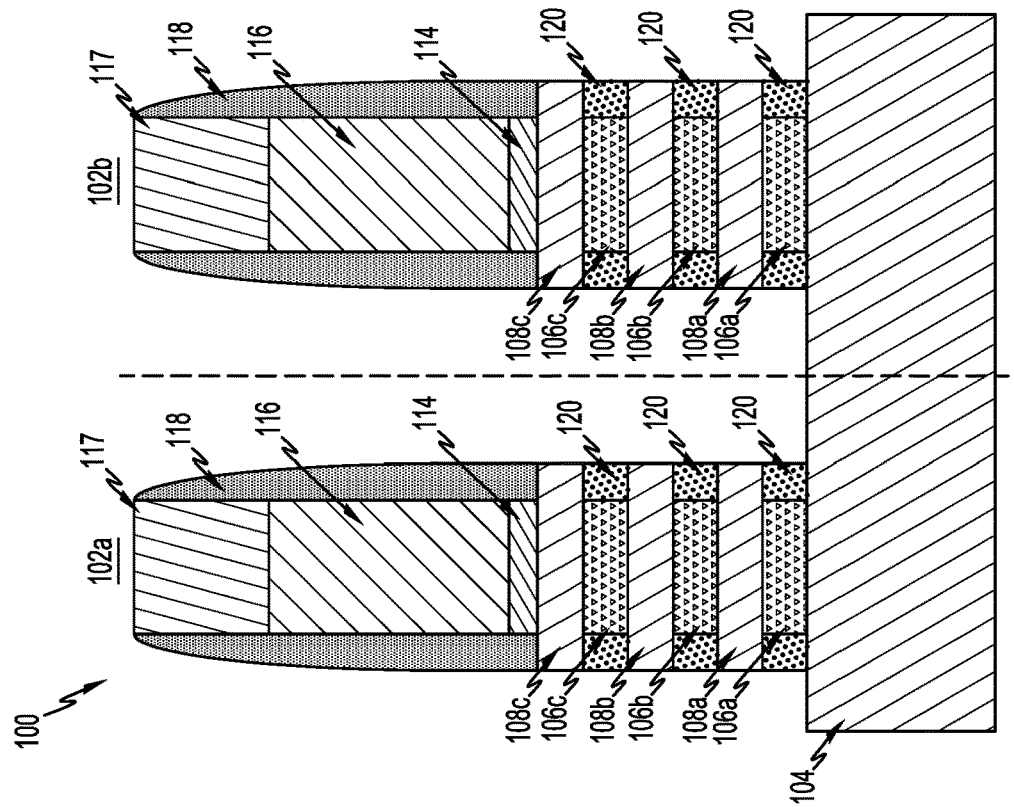
FIG. 6A is a cross-sectional view illustrating the semiconductor structure taken along the X-X axis of FIG. 2A at a sixth-intermediate fabrication stage, according to an illustrative embodiment.

FIGS. 6A and 6B illustrate semiconductor structure 100 at a sixth-intermediate fabrication stage. During this stage, the exposed portion of the top layer 108c in the PFET and NFET regions together with the alternating layers between adjacent dummy gates 116, i.e., the portions which are not underneath sidewall spacers 118 and dummy gates 116, are removed by etching to expose a top surface of substrate 104 and form fins. Etching can be carried out by using a direction etching technique such as RIE.

After etching is completed, sacrificial layers 106a, 106b and 106c of each of the fins are laterally etched to remove an outer portion of each of sacrificial layers 106a, 106b and 106c and form a divot (not shown). The lateral etching of sacrificial layers 106a, 106b and 106c may be performed using, for example, an isotropic etch such as gas phase etch, plasm etch, or wet etch. Inner spacers 120 are then formed in the etched portions of sacrificial layers 106a, 106b and 106c. Inner spacers 120 can be composed of any suitable dielectric material, for example silicon nitride, silicon oxide, silicon dioxide, silicon oxynitride, SiCN, SiOCN, SiOC, SiBCN, a dielectric metal oxide, a dielectric metal nitride, or a combination thereof. In one embodiment, the dielectric material is silicon nitride.

Inner spacers 120 can be formed by techniques known in the art. For example, a thin dielectric layer can be deposited on substrate 104 and over dummy gates 116 filling the divots. The dielectric layer can be deposited using a deposition process, such as CVD, ALD, PECVD, metal organic chemical vapor deposition (MOCVD) or other like chemical vapor deposition processes. Next, the dielectric layer is selectively etched by an etch back process to remove the dielectric layer from the exterior surface of structure 100 while leaving the dielectric layer in the space defined by the divots to form inner spacers 120. In this exemplary embodiment, the dielectric layer can be etched back to the level of the exterior surface of Si layers 108a, 108b and 108c by, for example, an isotropic etching process such as vapor phase dry etch or wet etching.

FIGS. 7A and 7B illustrate semiconductor structure 100 at a seventh-intermediate fabrication stage. During this stage, source/drain region 122a is epitaxially grown in PFET region 102a and source/drain region 122b is epitaxially grown in NFET region 102b, as shown in FIG. 7A. Each of source/drain regions 122a and 122b are formed on substrate 104, around the sidewalls of silicon layers 108a, 108b and 108c, inner spacers 120 and on a portion of sidewall spacers 118. The epitaxially grown source/drain regions 122a and 122b can be in-situ doped, meaning dopants are incorporated into the epitaxy film during the epitaxy process. Other alternative doping techniques can be used, including but not limited to, for example, ion implantation, gas phase doping, plasma doping, plasma immersion ion implantation, cluster doping, infusion doping, liquid phase doping, solid phase doping, etc. Suitable dopants include, for example, an n-type dopant selected from a group of phosphorus (P), arsenic (As) and antimony (Sb), or a p-type dopant selected from a group of boron (B), gallium (Ga), indium (In), and thallium (Tl) at various concentrations. For example, in a non-limiting example, a dopant concentration range may be $1\times10^{18}/cm^3$ to $5\times10^{21}/cm^3$. Accordingly, source/drain region 122a is a PFET and source/drain region 122b is an NFET.

FIGS. 8A and 8B illustrate semiconductor structure 100 at an eighth-intermediate fabrication stage. During this stage, interlevel dielectric (ILD) layer 124 is deposited on a top surface of each of source/drain regions 122a and 122b between adjacent sidewall spacers 118. The ILD layer 124 includes, for example, any suitable dielectric material such as silicon oxide, silicon nitride, hydrogenated silicon carbon oxide, silicon based low-k dielectrics, flowable oxides, porous dielectrics, or organic dielectrics including porous organic dielectrics. Non-limiting examples of suitable low-k dielectric materials include a spin-on-glass, a flowable oxide, a high density plasma oxide, borophosphosilicate glass (BPSG), or any combination thereof. The ILD layer 124 may be formed using any suitable deposition techniques including CVD, ALD, PVD, PECVD, chemical solution deposition or other like processes. ILD layer 124 is then planarized by, for example, a planarization process such as CMP such that hardmask 117 is removed and ILD layer 124 is coplanar with dummy gate 116 and sidewall spacers 118.

FIGS. 9A and 9B illustrate semiconductor structure 100 at a ninth-intermediate fabrication stage. During this stage, dummy gate 116 is removed to form a via between sidewall spacers 118 using any known removal process for the material being removed. In one embodiment, dummy gate 116 is removed using any suitable wet etch, such as ammonia followed by a HF based solution, or a highly selective dry etch.

Next, organic planarization layer (OPL) 126 is selectively formed by a patterning process into the via between sidewall spacers 118 in the NFET region 102b (FIG. 9A), and on the exterior surface of liner layer 114 in the NFET region 102b (FIG. 9B). The OPL 126 can be selectively deposited using, e.g., a spin-on coating process followed by a patterning process to remove it from PFET region. The OPL 126 can be a self-planarizing organic material that includes carbon, hydrogen, oxygen, and optionally nitrogen, fluorine, and silicon. In one embodiment, the self-planarizing organic material can be a polymer with sufficiently low viscosity so that the top surface of the applied polymer forms a planar horizontal surface. In one embodiment, the OPL 126 can include a transparent organic polymer. The OPL can be a standard CxHy polymer. Suitable OPL materials include, for example, CHM701B, commercially available from Cheil Chemical Co., Ltd., HM8006 and HM8014, commercially available from JSR Corporation, and ODL-102 or ODL-401, commercially available from ShinEtsu Chemical, Co., Ltd.

FIGS. 10A and 10B illustrate semiconductor structure 100 at a tenth-intermediate fabrication stage. It is to be appreciated that the dashed lines in the Y cross section location indicate support for connecting elements 108a, 108b and 108c to semiconductor structure 100, which is shown in semiconductor structure 100 set forth in the X cross-section location. During this stage, liner layer 114 and sacrificial layers 106a, 106b and 106c in the PFET region 102a are selectively removed using any known removal process. In one embodiment, liner layer 114 in the PFET region 102a is selectively removed using any suitable wet etch, such as ammonia followed by a HF based solution, or a highly selective dry etch. Sacrificial layers 106a, 106b and 106c in the PFET region 102a may be removed using an etchant that etches the sacrificial material such as silicon germanium at a higher rate than the silicon, e.g., $NH_4OH:H_2O_2$: $H_2O$ (ammonia peroxide mixture, APM), $H_2SO_4+H$ $H_2O_2$ (sulfuric acid peroxide mixture, SPM), or the like. This etching process removes the sacrificial layers 106a, 106b and 106c, thereby forming nanosheets.

Figures 11A, 11B:
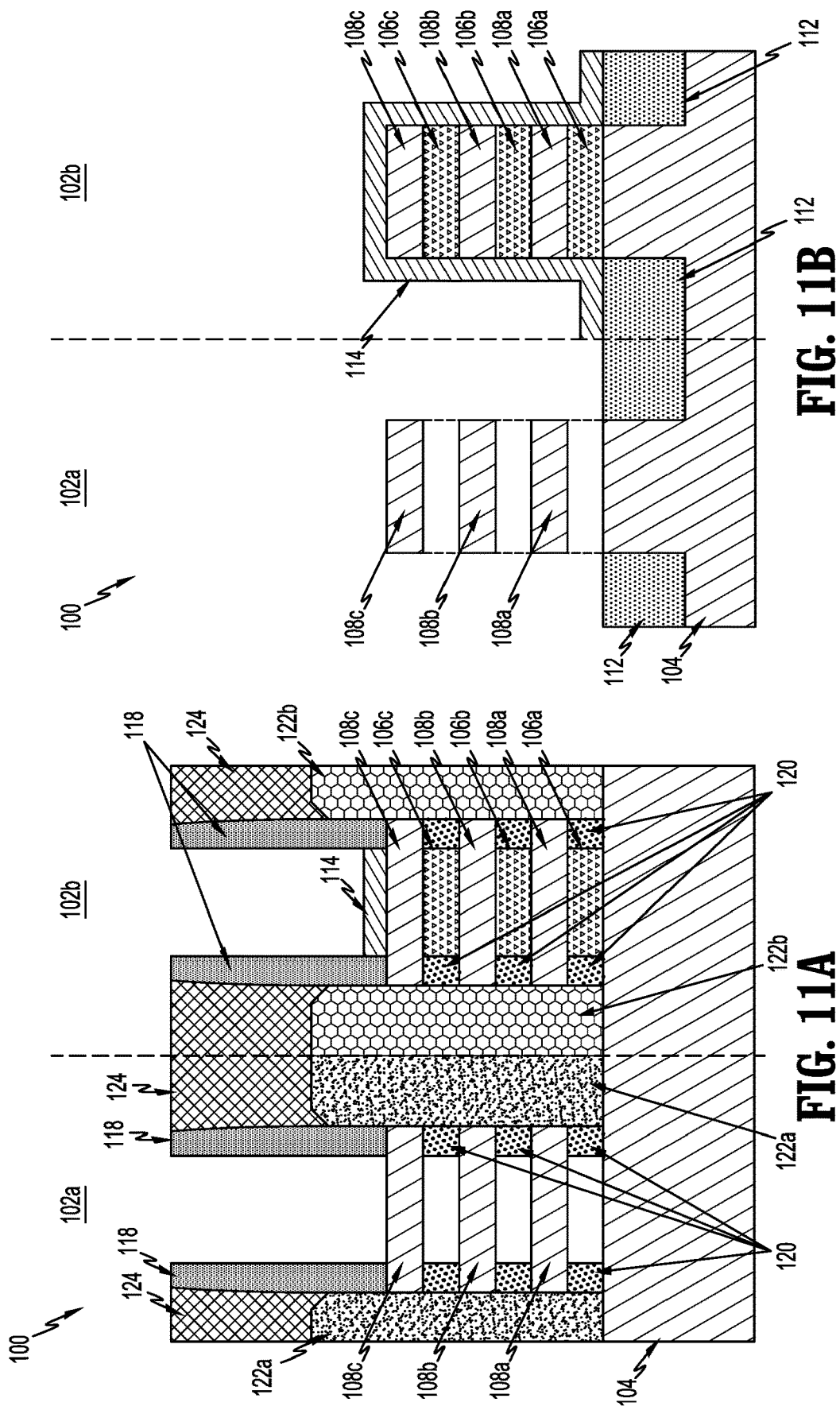
FIG. 11A is a cross-sectional view illustrating the semiconductor structure taken along the X-X axis of FIG. 2A at an eleventh-intermediate fabrication stage, according to an illustrative embodiment.
FIG. 11B is a cross-sectional view of the semiconductor structure taken along the Y-Y axis of FIG. 2A at the eleventh-intermediate fabrication stage, according to an illustrative embodiment.

FIGS. 11A and 11B illustrate semiconductor structure 100 at an eleventh-intermediate fabrication stage. It is to be appreciated that the dashed lines in the Y cross section location indicate support for connecting elements 108a, 108b and 108c to semiconductor structure 100, which is shown in semiconductor structure 100 set forth in the X cross-section location. During this stage, OPL 126 is removed by any suitable process, e.g., using a standard $O_2$ or $N_2/H_2$ based OPL ash.

Figures 12A, 12B:
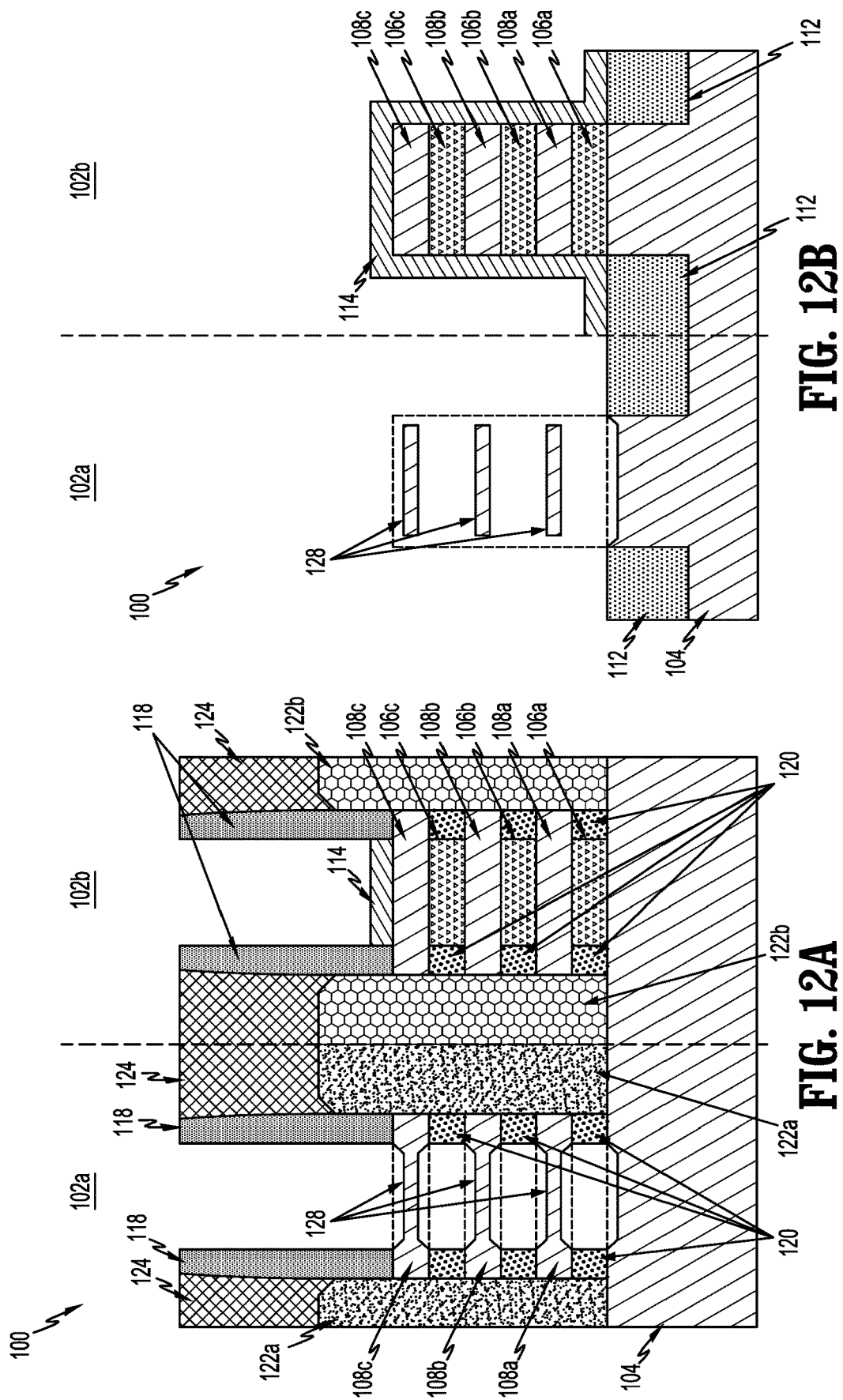
FIG. 12A is a cross-sectional view illustrating the semiconductor structure taken along the X-X axis of FIG. 2A at a twelfth-intermediate fabrication stage, according to an illustrative embodiment.
FIG. 12B is a cross-sectional view of the semiconductor structure taken along the Y-Y axis of FIG. 2A at the twelfth-intermediate fabrication stage, according to an illustrative embodiment.

FIGS. 12A and 12B illustrate semiconductor structure 100 at a twelfth-intermediate fabrication stage. It is to be appreciated that the dashed lines in the Y cross section location indicate support for connecting elements 108a, 108b and 108c to semiconductor structure 100, which is shown in semiconductor structure 100 set forth in the X cross-section location. During this stage, the exposed portion 128 of silicon layers 108a, 108b and 108c are trimmed using a wet etch (e.g., employing buffered hydrofluoric acid (HF)) or a dry etch. In one embodiment, the silicon nanosheet layers 108a, 108b and 108c can be trimmed as much as possible without corrupting the silicon nanosheet. For example, in one embodiment, a silicon nanosheet is trimmed so that the silicon nanosheet has a thickness of about 0.5 nanometers (nm) to about 1 nm. In another illustrative embodiment, a silicon nanosheet is trimmed so that the silicon nanosheet has a thickness of about 1 nm to about 5 nm.

Figures 13A, 13B:
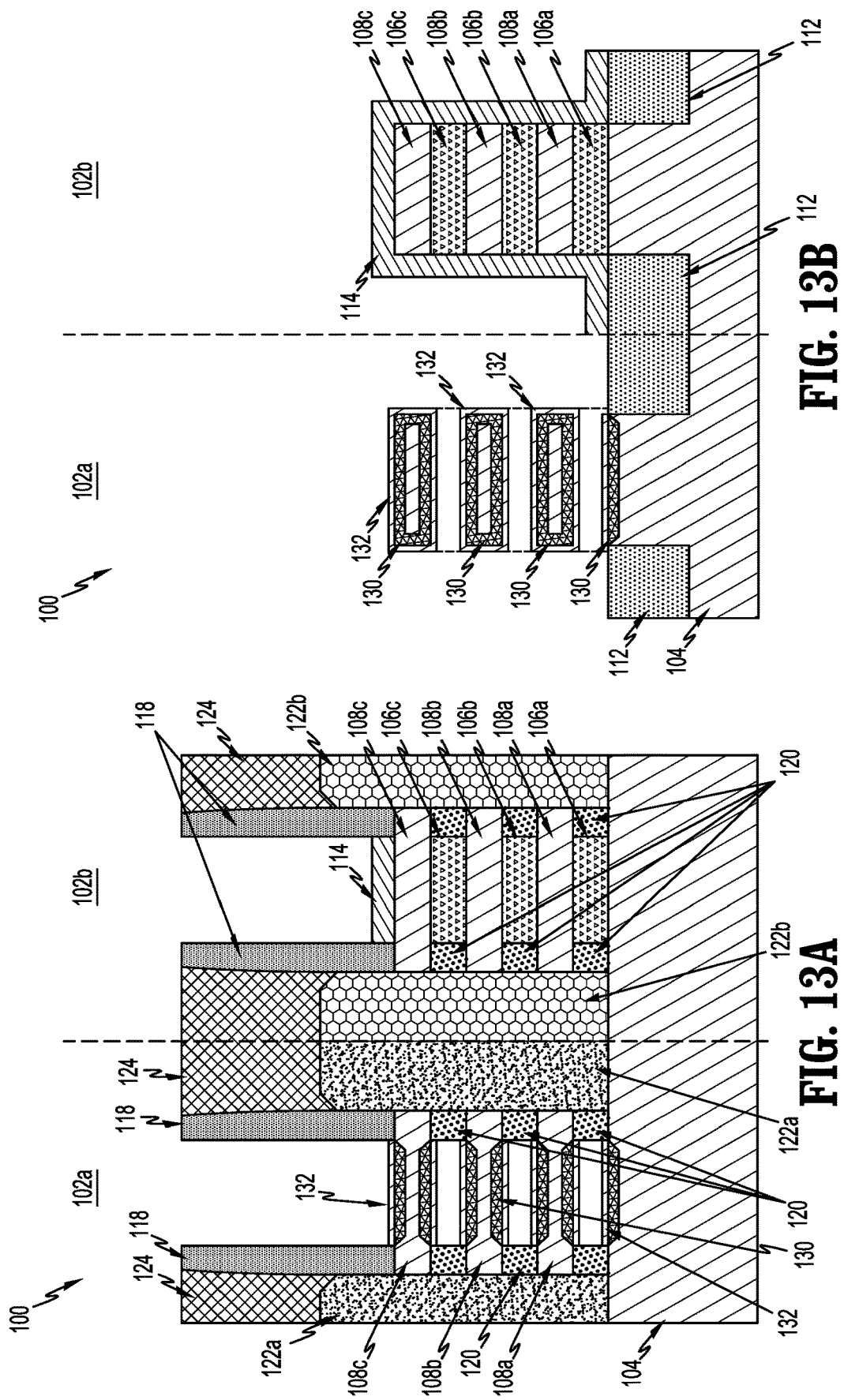
FIG. 13A is a cross-sectional view illustrating the semiconductor structure taken along the X-X axis of FIG. 2A at a thirteenth-intermediate fabrication stage, according to an illustrative embodiment.
FIG. 13B is a cross-sectional view of the semiconductor structure taken along the Y-Y axis of FIG. 2A at the thirteenth-intermediate fabrication stage, according to an illustrative embodiment.

FIGS. 13A and 13B illustrate semiconductor structure 100 at a thirteenth-intermediate fabrication stage. It is to be appreciated that the dashed lines in the Y cross section location indicate support for connecting elements 108a, 108b and 108c to semiconductor structure 100, which is shown in semiconductor structure 100 set forth in the X cross-section location. During this stage, SiGe cladding layers 130 are formed on the upper and lower trimmed surfaces Si layers 108a-108c using an epitaxial growth process. In particular embodiments, the trimmed surfaces 128 include multiple silicon crystal lattice-oriented surfaces such as {110}, {111}, {113}, {115}, etc., in which the rate of SiGe epitaxy growth is much less than that of a {100}plane silicon surface of the upper and lower surfaces of Si layers 108a-108c. Accordingly, the epitaxial growth of SiGe cladding layers 130 is kept away from inner spacers 120 and sidewall spaces 118.

Next, a protective liner layer 132 is deposited on cladding layer 130 to form a strained channel comprising a composite of silicon germanium and silicon. Protective liner layer 132 can be deposited by any conventional technique such as, for example, CVD, LPCVD, PECVD and the like. Suitable material for protective liner layer 132 includes, for example, silicon, i.e., a silicon cap layer. The thickness of protective liner layer 132 can be from about 0.5 nm to about 5 nm.

Figures 14A, 14B:
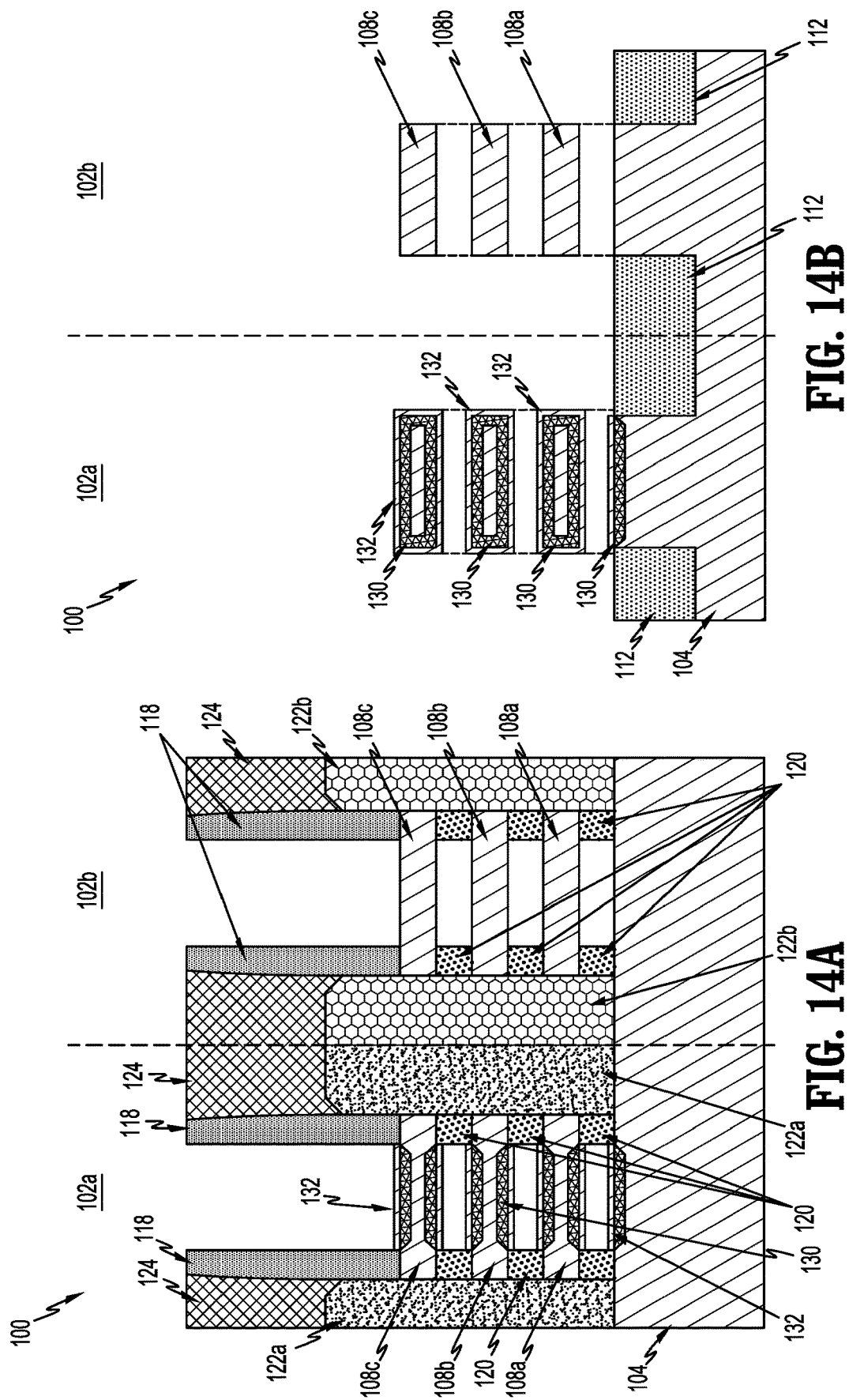
FIG. 14A is a cross-sectional view illustrating the semiconductor structure taken along the X-X axis of FIG. 2A at a fourteenth-intermediate fabrication stage, according to an illustrative embodiment.
FIG. 14B is a cross-sectional view of the semiconductor structure taken along the Y-Y axis of FIG. 2A at the fourteenth-intermediate fabrication stage, according to an illustrative embodiment.

FIGS. 14A and 14B illustrate semiconductor structure 100 at a fourteenth-intermediate fabrication stage. It is to be appreciated that the dashed lines in the Y cross section location indicate support for connecting elements 108a, 108b and 108c to semiconductor structure 100, which is shown in semiconductor structure 100 set forth in the X cross-section location. During this stage, liner layer 114 and sacrificial layers 106a, 106b and 106c in the NFET region 102b are selectively removed using any known removal process as discussed above. In one embodiment, the protective liner layer 132 can be left without removal, so that the protective liner layer 132 will be consumed during formation of the interfacial layer 134 as discussed hereinbelow. In this manner, the protective liner layer 132 on the SiGe cladding layers 130 will exhibit greater interface characteristics compared to SiGe cladding layers 130 alone without the protective liner layer 132. As one skilled in the art will appreciate, the protective liner layer 132 may remain on SiGe cladding layers 130 following the formation of the interfacial layer 134 depending on the initial growth thickness of the protective liner layer 132. In one embodiment, protective liner layer 132 in the PFET region 102a is removed using any suitable wet or dry etch.

Figures 15A, 15B:
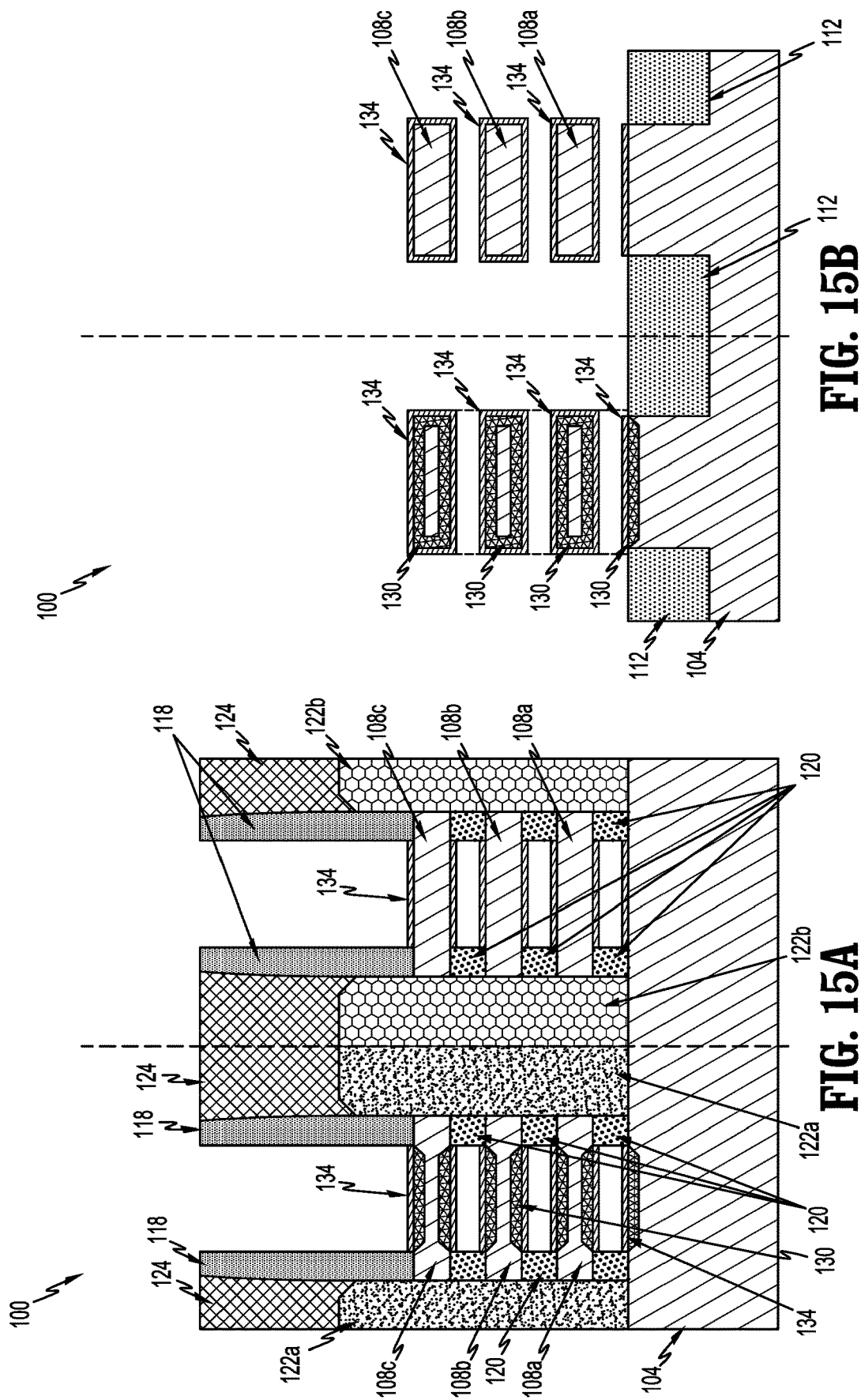
FIG. 15A is a cross-sectional view illustrating the semiconductor structure taken along the X-X axis of FIG. 2A at a fifteenth-intermediate fabrication stage, according to an illustrative embodiment.
FIG. 15B is a cross-sectional view of the semiconductor structure taken along the Y-Y axis of FIG. 2A at the fifteenth-intermediate fabrication stage, according to an illustrative embodiment.

FIGS. 15A and 15B illustrate semiconductor structure 100 at a fifteenth-intermediate fabrication stage. It is to be appreciated that the dashed lines in the Y cross section location indicate support for connecting elements 108a, 108b and 108c to semiconductor structure 100, which is shown in semiconductor structure 100 set forth in the X cross-section location. During this stage, interfacial layer 134 is deposited on the exterior surfaces of cladding layer 130 in the PFET region 102a and on silicon layers 108a, 108b and 108c the NFET region 102b using conventional techniques. For example, a conventional thermal growing technique such as oxidation or oxynitridation can be used to form the interfacial layer 134. Suitable material for interfacial layer 134 includes, for example, an oxide or dielectric material such as silicon oxide, silicon oxynitride, or a nitrided silicon oxide. The thickness of interfacial layer 134 can be from about 0.5 nm to about 2 nm.

FIGS. 16A and 16B illustrate semiconductor structure 100 at a sixteenth-intermediate fabrication stage. During this stage a replacement metal gate is formed on semiconductor structure 100. First, a high-k gate dielectric layer 136 is deposited on semiconductor structure 100 employing, for example, CVD. Suitable high-k dielectric material includes, for example, hafnium oxide ($HfO_2$), HfSiO, HfSiON, AlO, $Al_2O_3$, titanium oxide ($TiO_2$), lanthanum oxide ($La_2O_3$) or a combination or stack thereof. A work function metal 138 is then formed on a portion of dielectric layer 136 employing, for example, CVD, sputtering, or plating. The work function metal 138 includes one or more metals having a function suitable to tune the work function of the PFET region 102a and the NFET region 102b. For example, suitable work function metals include titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC), and combinations thereof. In some embodiments, a conductive material or a combination of multiple conductive materials can serve as both gate conductor and work function metal. The gate conductor and work function metal can be formed by any suitable process or any suitable combination of multiple processes, including but not limited to, atomic layer deposition (ALD), chemical vapor deposition (CVD), physical vapor deposition (PVD), sputtering, plating, evaporation, ion beam deposition, electron beam deposition, laser assisted deposition, chemical solution deposition, etc.

It is to be understood that the methods discussed herein for fabricating semiconductor structures (e.g., a CMOS) can be incorporated within semiconductor processing flows for fabricating other types of semiconductor structures and integrated circuits with various analog and digital circuitry or mixed-signal circuitry. In particular, integrated circuit dies can be fabricated with various devices such as field-effect transistors, bipolar transistors, metal-oxide-semiconductor transistors, diodes, capacitors, inductors, etc. An integrated circuit in accordance with non-limiting illustrative embodiments can be employed in applications, hardware, and/or electronic systems. Suitable hardware and systems for implementing the non-limiting illustrative embodiments may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein. Given the teachings of the non-limiting illustrative embodiments provided herein, one of ordinary skill in the art will be able to contemplate other implementations and applications of the techniques described herein.

Although illustrative embodiments have been described herein with reference to the accompanying drawings, it is to be understood that the invention is not limited to those precise embodiments, and that various other changes and modifications may be made by one skilled in art without departing from the scope or spirit of thereof.

What is claimed is:

1. A semiconductor structure, comprising:
   a p-type field-effect transistor region, wherein the p-type field-effect transistor region comprises a strained channel comprising a composite of silicon germanium and silicon comprising a plurality of silicon nanosheets each comprising a middle portion having a first thickness and outer portions having a second thickness greater than the first thickness and a silicon germanium cladding layer surrounding the middle portion of the silicon nanosheet; and
   an n-type field-effect transistor region, wherein the n-type field-effect transistor region comprises a silicon channel.

2. The semiconductor structure according to claim 1, wherein the silicon channel in the n-type field-effect transistor region is aligned with the strained channel in the p-type field-effect transistor region.

3. The semiconductor structure according to claim 1, further comprising a silicon cap layer disposed on the silicon germanium cladding layer.

4. The semiconductor structure according to claim 1, wherein the strained channel further comprises an interfacial layer disposed on the silicon germanium cladding layer.

5. The semiconductor structure according to claim 1, wherein the strained channel further comprises a silicon cap layer disposed on the silicon germanium cladding layer and an interfacial layer disposed on the silicon cap layer.

6. The semiconductor structure according to claim 1, wherein the silicon germanium cladding layer disposed on the middle portion of the silicon nanosheet is in a gate region of the p-type field-effect transistor region.

7. The semiconductor structure according to claim 6, wherein the strained channel further comprises a silicon cap layer disposed on the silicon germanium cladding layer.

8. The semiconductor structure according to claim 6, wherein the strained channel further comprises an interfacial layer disposed on the silicon germanium cladding layer.

9. The semiconductor structure according to claim 6, wherein the strained channel further comprises a silicon cap layer disposed on the silicon germanium cladding layer and an interfacial layer disposed on the silicon cap layer.

10. The semiconductor structure according to claim 1, wherein the p-type field-effect transistor region comprises a source/drain region disposed on each side of the strained channel, and the n-type field-effect transistor region comprising a source/drain region disposed on each side of the silicon channel.

11. The semiconductor structure according to claim 10, wherein each of the p-type field-effect transistor region and the n-type field-effect transistor region further comprises a gate structure.

12. An integrated circuit, comprising:
a plurality of semiconductor structures, wherein at least one of the plurality of semiconductor structures comprises:
a p-type field-effect transistor region, wherein the p-type field-effect transistor region comprises a strained channel comprising a composite of silicon germanium and silicon comprising a plurality of silicon nanosheets each comprising a middle portion having a first thickness and outer portions having a second thickness greater than the first thickness and a silicon germanium cladding layer surrounding the middle portion of the silicon nanosheet; and
an n-type field-effect transistor region, wherein the n-type field-effect transistor region comprises a silicon channel.

13. The integrated circuit according to claim 12, wherein the silicon channel in the n-type field-effect transistor region is aligned with the strained channel in the p-type field-effect transistor region.

14. The integrated circuit according to claim 12, wherein the strained channel further comprises a silicon cap layer disposed on the silicon germanium cladding layer.

15. The integrated circuit according to claim 12, wherein the strained channel further comprises an interfacial layer disposed on the silicon germanium cladding layer.

16. The integrated circuit according to claim 12, wherein the strained channel further comprises a silicon cap layer disposed on the silicon germanium cladding layer and an interfacial layer disposed on the silicon cap layer.

17. The integrated circuit according to claim 12, wherein each of the p-type field-effect transistor region and the n-type field-effect transistor region further comprises a source/drain region and a gate structure.

18. A method for making a semiconductor structure, comprising:
forming a p-type field-effect transistor region, wherein the p-type field-effect transistor region comprises a strained channel comprising a composite of silicon germanium and silicon comprising a plurality of silicon nanosheets each comprising a middle portion having a first thickness and outer portions having a second thickness greater than the first thickness and a silicon germanium cladding layer surrounding the middle portion of the silicon nanosheet; and
forming an n-type field-effect transistor region, wherein the n-type field-effect transistor region comprises a silicon channel.

19. The method according to claim 18, wherein the silicon channel in the n-type field-effect transistor region is aligned with the strained channel in the p-type field-effect transistor region.

20. The method according to claim 18, further comprising forming an interfacial layer disposed on the silicon germanium cladding layer.

* * * * *